(12) United States Patent
Antonelli et al.

(10) Patent No.: US 9,337,068 B2
(45) Date of Patent: May 10, 2016

(54) OXYGEN-CONTAINING CERAMIC HARD MASKS AND ASSOCIATED WET-CLEANS

(71) Applicant: Lam Research Corporation, Fremont, CA (US)

(72) Inventors: George Andrew Antonelli, Portland, OR (US); Alice Hollister, Tigard, OR (US); Sirish Reddy, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 229 days.

(21) Appl. No.: 14/105,026

(22) Filed: Dec. 12, 2013

(65) Prior Publication Data

US 2014/0175617 A1 Jun. 26, 2014

Related U.S. Application Data

(60) Provisional application No. 61/738,599, filed on Dec. 18, 2012.

(51) Int. Cl.
| | |
|---|---|
| *H01L 21/31* | (2006.01) |
| *H01L 21/67* | (2006.01) |
| *H01L 21/311* | (2006.01) |
| *H01L 21/02* | (2006.01) |
| *H01L 21/3213* | (2006.01) |

(Continued)

(52) U.S. Cl.
CPC .......... *H01L 21/67207* (2013.01); *C23C 16/30* (2013.01); *H01L 21/02112* (2013.01); *H01L 21/02274* (2013.01); *H01L 21/31111* (2013.01); *H01L 21/31144* (2013.01); *H01L 21/32139* (2013.01); *H01L 21/67259* (2013.01); *H01L 21/76811* (2013.01); *H01L 21/76813* (2013.01)

(58) Field of Classification Search
CPC .................. H01L 21/67207; H01L 21/02112
See application file for complete search history.

(56) References Cited

U.S. PATENT DOCUMENTS

| | | | |
|---|---|---|---|
| 4,177,474 | A | 12/1979 | Ovshinsky |
| 4,656,110 | A | 4/1987 | Yamazaki |
| 4,952,658 | A | 8/1990 | Kalchauer et al. |

(Continued)

FOREIGN PATENT DOCUMENTS

| | | |
|---|---|---|
| CN | 101111930 A | 1/2008 |
| EP | 1 172 845 A2 | 1/2002 |

(Continued)

OTHER PUBLICATIONS

Yu et al., U.S. Appl. No. 13/032,392, filed Feb. 22, 2011, entitled "Diffusion Barrier and Etch Stop Films."

(Continued)

*Primary Examiner* — Bradley K Smith
(74) *Attorney, Agent, or Firm* — Weaver Austin Villeneuve & Sampson LLP

(57) ABSTRACT

A method of forming an oxygen-containing ceramic hard mask film on a semiconductor substrate involves receiving a semiconductor substrate in a plasma-enhanced chemical vapor deposition (PECVD) process chamber and depositing forming by PEVCD on the substrate an oxygen-containing ceramic hard mask film, the film being etch selective to low-k dielectric and copper, resistant to plasma dry-etch and removable by wet-etch. The method may further involve removing the oxygen-containing ceramic hard mask film from the substrate with a wet etch. Corresponding films and apparatus are also provided.

16 Claims, 14 Drawing Sheets

(51) Int. Cl.
*C23C 16/30* (2006.01)
*H01L 21/768* (2006.01)

(56) References Cited

U.S. PATENT DOCUMENTS

| | | | |
|---|---|---|---|
| 4,968,384 A | 11/1990 | Asano | |
| 5,034,355 A | 7/1991 | Tani et al. | |
| 5,088,003 A | 2/1992 | Sakai et al. | |
| 5,108,965 A | 4/1992 | Baldi | |
| 5,281,546 A | 1/1994 | Possin et al. | |
| 5,324,690 A | 6/1994 | Gelatos et al. | |
| 5,447,816 A | 9/1995 | Kodama et al. | |
| 5,464,699 A | 11/1995 | Baldi | |
| 5,648,175 A | 7/1997 | Russell et al. | |
| 5,654,208 A | 8/1997 | Harris et al. | |
| 5,739,579 A | 4/1998 | Chiang et al. | |
| 5,849,640 A | 12/1998 | Hsia et al. | |
| 5,958,324 A | 9/1999 | Bujalski et al. | |
| 6,020,035 A | 2/2000 | Gupta et al. | |
| 6,045,877 A | 4/2000 | Gleason et al. | |
| 6,100,587 A | 8/2000 | Merchant et al. | |
| 6,150,719 A | 11/2000 | Saia et al. | |
| 6,159,871 A | 12/2000 | Loboda et al. | |
| 6,171,661 B1 | 1/2001 | Zheng et al. | |
| 6,197,688 B1 | 3/2001 | Simpson | |
| 6,242,686 B1 | 6/2001 | Kishimoto et al. | |
| 6,262,445 B1 | 7/2001 | Swanson et al. | |
| 6,268,288 B1 | 7/2001 | Hautala et al. | |
| 6,316,167 B1 * | 11/2001 | Angelopoulos | C23C 16/30 257/E21.029 |
| 6,352,945 B1 | 3/2002 | Matsuki | |
| 6,383,898 B1 | 5/2002 | Kishimoto | |
| 6,383,955 B1 | 5/2002 | Matsuki | |
| 6,399,484 B1 | 6/2002 | Yamasaki et al. | |
| 6,410,419 B1 | 6/2002 | Merchant et al. | |
| 6,417,092 B1 | 7/2002 | Jain et al. | |
| 6,424,044 B1 | 7/2002 | Han et al. | |
| 6,432,846 B1 | 8/2002 | Matsuki | |
| 6,444,036 B2 | 9/2002 | Chern et al. | |
| 6,455,409 B1 | 9/2002 | Subramanian et al. | |
| 6,455,417 B1 | 9/2002 | Bao et al. | |
| 6,465,366 B1 | 10/2002 | Nemani et al. | |
| 6,465,372 B1 | 10/2002 | Xia et al. | |
| 6,506,692 B2 | 1/2003 | Andideh | |
| 6,570,256 B2 | 5/2003 | Conti et al. | |
| 6,596,654 B1 | 7/2003 | Bayman et al. | |
| 6,670,715 B2 | 12/2003 | Yang et al. | |
| 6,677,253 B2 | 1/2004 | Andideh et al. | |
| 6,680,262 B2 | 1/2004 | Andideh et al. | |
| 6,734,118 B2 | 5/2004 | Kloster et al. | |
| 6,764,958 B1 | 7/2004 | Nemani et al. | |
| 6,767,836 B2 | 7/2004 | San et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,812,043 B2 | 11/2004 | Bao et al. | |
| 6,855,645 B2 | 2/2005 | Tang et al. | |
| 6,867,143 B1 | 3/2005 | Furukawa et al. | |
| 6,875,687 B1 | 4/2005 | Weidman et al. | |
| 6,881,683 B2 | 4/2005 | Matsuki et al. | |
| 6,890,850 B2 | 5/2005 | Lee et al. | |
| 6,930,013 B2 | 8/2005 | Choi et al. | |
| 6,967,405 B1 | 11/2005 | Yu et al. | |
| 6,991,959 B2 | 1/2006 | Goundar et al. | |
| 7,064,088 B2 | 6/2006 | Hyodo et al. | |
| 7,091,137 B2 | 8/2006 | Lee et al. | |
| 7,094,713 B1 | 8/2006 | Niu et al. | |
| 7,115,534 B2 | 10/2006 | Nguyen et al. | |
| 7,132,374 B2 | 11/2006 | Mak et al. | |
| 7,163,889 B2 | 1/2007 | Yu et al. | |
| 7,200,460 B2 | 4/2007 | Campana et al. | |
| 7,239,017 B1 | 7/2007 | Yu et al. | |
| 7,253,125 B1 | 8/2007 | Bandyopadhyay et al. | |
| 7,282,438 B1 | 10/2007 | Yu et al. | |
| 7,326,444 B1 | 2/2008 | Wu et al. | |
| 7,341,761 B1 | 3/2008 | Wu et al. | |
| 7,381,662 B1 | 6/2008 | Niu et al. | |
| 7,390,537 B1 | 6/2008 | Wu et al. | |
| 7,420,275 B1 | 9/2008 | Yu et al. | |
| 7,468,290 B2 | 12/2008 | Lukas et al. | |
| 7,573,061 B1 | 8/2009 | Yu et al. | |
| 7,622,400 B1 | 11/2009 | Fox et al. | |
| 7,842,604 B1 | 11/2010 | Yu et al. | |
| 7,915,166 B1 | 3/2011 | Yu et al. | |
| 7,923,385 B2 | 4/2011 | Wu et al. | |
| 7,968,436 B1 | 6/2011 | Yu et al. | |
| 8,124,522 B1 | 2/2012 | Wu et al. | |
| 8,173,537 B1 | 5/2012 | Chattopadhyay et al. | |
| 8,178,443 B2 | 5/2012 | Rangarajan et al. | |
| 8,247,332 B2 | 8/2012 | Rangarajan et al. | |
| 8,536,073 B2 | 9/2013 | Rangarajan et al. | |
| 8,669,181 B1 | 3/2014 | Yu et al. | |
| 8,846,525 B2 | 9/2014 | Rangarajan et al. | |
| 2001/0021491 A1 | 9/2001 | Chen et al. | |
| 2002/0016085 A1 | 2/2002 | Huang et al. | |
| 2002/0019148 A1 | 2/2002 | Hawryluk et al. | |
| 2002/0024117 A1 | 2/2002 | Russell et al. | |
| 2002/0076946 A1 | 6/2002 | Kim et al. | |
| 2002/0106500 A1 | 8/2002 | Albano et al. | |
| 2002/0106891 A1 | 8/2002 | Kim et al. | |
| 2003/0001275 A1 | 1/2003 | Sambucetti et al. | |
| 2003/0036215 A1 | 2/2003 | Reid | |
| 2003/0049375 A1 | 3/2003 | Nguyen et al. | |
| 2003/0049460 A1 | 3/2003 | O'Neill et al. | |
| 2003/0057553 A1 | 3/2003 | DelaRosa et al. | |
| 2003/0064607 A1 | 4/2003 | Leu et al. | |
| 2003/0068881 A1 | 4/2003 | Xia et al. | |
| 2003/0077896 A1 | 4/2003 | Saito et al. | |
| 2003/0082296 A1 | 5/2003 | Elers et al. | |
| 2003/0089992 A1 | 5/2003 | Rathi et al. | |
| 2003/0162033 A1 | 8/2003 | Johnson et al. | |
| 2003/0194496 A1 | 10/2003 | Xu et al. | |
| 2003/0232150 A1 | 12/2003 | Arnold et al. | |
| 2003/0232514 A1 | 12/2003 | Kim et al. | |
| 2004/0067308 A1 | 4/2004 | Zheng et al. | |
| 2004/0084680 A1 | 5/2004 | Ruelke et al. | |
| 2004/0084774 A1 | 5/2004 | Li et al. | |
| 2004/0089924 A1 | 5/2004 | Yuasa et al. | |
| 2004/0113279 A1 | 6/2004 | Chen et al. | |
| 2004/0124531 A1 | 7/2004 | Venkatraman et al. | |
| 2004/0151845 A1 | 8/2004 | Nguyen et al. | |
| 2004/0161535 A1 | 8/2004 | Goundar et al. | |
| 2004/0178169 A1 * | 9/2004 | Desphande | H01L 21/0276 216/12 |
| 2004/0194706 A1 | 10/2004 | Wang et al. | |
| 2004/0207084 A1 | 10/2004 | Hedrick et al. | |
| 2005/0014361 A1 | 1/2005 | Nguyen et al. | |
| 2005/0042889 A1 | 2/2005 | Lee et al. | |
| 2005/0045206 A1 | 3/2005 | Smith et al. | |
| 2005/0100682 A1 | 5/2005 | Fukiage et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0255714 A1 | 11/2005 | Iyer et al. | |
| 2005/0260357 A1 | 11/2005 | Olsen et al. | |
| 2005/0277302 A1 | 12/2005 | Nguyen et al. | |
| 2005/0287811 A1 | 12/2005 | Inukai | |
| 2006/0019486 A1 | 1/2006 | Yu et al. | |
| 2006/0040507 A1 | 2/2006 | Mak et al. | |
| 2006/0110931 A1 | 5/2006 | Fukazawa et al. | |
| 2007/0004204 A1 | 1/2007 | Fukazawa et al. | |
| 2007/0077751 A1 | 4/2007 | Chen et al. | |
| 2007/0128882 A1 | 6/2007 | Nguyen et al. | |
| 2007/0166546 A1 | 7/2007 | Ichikawa et al. | |
| 2007/0232071 A1 | 10/2007 | Balseanu et al. | |
| 2007/0281497 A1 | 12/2007 | Liu et al. | |
| 2008/0050933 A1 | 2/2008 | Ozaki et al. | |
| 2008/0063809 A1 | 3/2008 | Lee et al. | |
| 2008/0064173 A1 | 3/2008 | Hung | |
| 2008/0070396 A1 | 3/2008 | Budrevich et al. | |
| 2008/0122103 A1 | 5/2008 | Bonilla et al. | |
| 2008/0128907 A1 | 6/2008 | Yang et al. | |
| 2008/0173984 A1 | 7/2008 | Lin et al. | |

(56) References Cited

U.S. PATENT DOCUMENTS

| | | | |
|---|---|---|---|
| 2008/0194105 | A1 | 8/2008 | Dominguez et al. |
| 2008/0254641 | A1 | 10/2008 | Kobayashi et al. |
| 2009/0042402 | A1 | 2/2009 | Morioka |
| 2009/0082240 | A1 | 3/2009 | Nukui et al. |
| 2009/0215282 | A1 | 8/2009 | Moore et al. |
| 2009/0218699 | A1 | 9/2009 | Torres et al. |
| 2009/0258487 | A1 | 10/2009 | Lin et al. |
| 2009/0294925 | A1 | 12/2009 | Lin et al. |
| 2010/0081293 | A1 | 4/2010 | Mallick et al. |
| 2010/0207274 | A1 | 8/2010 | Hayashi et al. |
| 2010/0308463 | A1* | 12/2010 | Yu ............ H01L 21/02074 257/753 |
| 2011/0027957 | A1 | 2/2011 | Berry |
| 2011/0045676 | A1 | 2/2011 | Park et al. |
| 2011/0111590 | A1 | 5/2011 | Edelstein et al. |
| 2011/0114994 | A1 | 5/2011 | Mandlik et al. |
| 2011/0133313 | A1 | 6/2011 | Rangarajan et al. |
| 2011/0135557 | A1 | 6/2011 | Rangarajan et al. |
| 2012/0276752 | A1 | 11/2012 | Rangarajan et al. |
| 2013/0129940 | A1 | 5/2013 | Xiao et al. |
| 2013/0157466 | A1* | 6/2013 | Fox ............ H01L 21/30604 438/694 |
| 2013/0242493 | A1 | 9/2013 | Shenoy et al. |
| 2013/0330932 | A1 | 12/2013 | Rangarajan et al. |
| 2013/0330935 | A1 | 12/2013 | Varadarajan |
| 2014/0356549 | A1 | 12/2014 | Varadarajan |
| 2015/0118394 | A1 | 4/2015 | Varadarajan et al. |
| 2015/0303056 | A1 | 10/2015 | Varadarajan et al. |

FOREIGN PATENT DOCUMENTS

| | | |
|---|---|---|
| EP | 1 186 685 A2 | 3/2002 |
| EP | 1 703 328 A | 9/2006 |
| JP | 2001-160547 | 6/2001 |
| JP | 2002-176100 | 6/2002 |
| JP | 2002-217189 | 8/2002 |
| JP | 2004-247725 | 9/2004 |
| JP | 2007-158000 | 6/2007 |
| JP | 2008-529296 | 7/2008 |
| TW | 535253 B | 6/2003 |
| TW | 200405437 | 4/2004 |
| TW | 200803988 | 1/2008 |
| TW | 200839884 | 10/2008 |
| TW | 200908138 | 2/2009 |
| WO | WO 02/21593 | 3/2002 |
| WO | WO 03/005429 | 1/2003 |
| WO | WO 2007/116492 | 10/2007 |

OTHER PUBLICATIONS

Varadarajan, Bhadri, U.S. Appl. No. 13/907,699, filed May 31, 2013, entitled "Method to Obtain SiC Class of Films of Desired Composition and Film Properties."
Wu et al., U.S. Appl. No. 11/369,658, filed Mar. 6, 2006, entitled "Methods for Fabricating High Hardness/Modules Low Dielectric Constant Materials."
Wu et al., U.S. Appl. No. 11/693,661, filed Mar. 29, 2007, entitled Methods for Improving Performance of ODC Film with Dielectric Constant <4.0.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
US Office Action, dated Dec. 20, 2005, issued in U.S. Appl. No. 10/849,568.
US Final Office Action, dated May 31, 2006, issued in U.S. Appl. No. 10/849,568.
US Office Action, dated Oct. 18, 2006, issued in U.S. Appl. No. 10/849,568.
US Final Office Action, dated Mar. 27, 2007, issued in U.S. Appl. No. 10/849,568.
US Office Action, dated Jun. 22, 2007, issued in U.S. Appl. No. 10/849,568.
US Office Action, dated Dec. 18, 2007, issued in U.S. Appl. No. 10/849,568.
US Final Office Action, dated Sep. 25, 2008, issued in U.S. Appl. No. 10/849,568.
US Office Action, dated Jan. 22, 2009, issued in U.S. Appl. No. 10/849,568.
US Notice of Allowance, dated Jul. 10, 2009, issued in U.S. Appl. No. 10/849,568.
US Office Action, dated May 22, 2007, issued in U.S. Appl. No. 11/376,510.
US Notice of Allowance, dated Sep. 27, 2007, issued in U.S. Appl. No. 11/376,510.
US Supplemental Notice of Allowance, dated May 6, 2008, issued in U.S. Appl. No. 11/376,510.
U.S. Office Action dated May 3, 2006 issued in U.S. Appl. No. 10/915,117.
US Final Office Action dated Sep. 7, 2006 issued in U.S. Appl. No. 10/915,117.
US Office Action dated Dec. 11, 2006 issued in U.S. Appl. No. 10/915,117.
US Notice of Allowance dated Feb. 26, 2007 issued in U.S. Appl. No. 10/915,117.
US Office Action dated May 1, 2008 issued in U.S. Appl. No. 11/373,847.
US Notice of Allowance and Allowed Claims dated Jul. 1, 2008 issued in U.S. Appl. No. 11/373,847.
US Office Action dated Apr. 10, 2009 issued in U.S. Appl. No. 11/805,356.
US Final Office Action dated Oct. 13, 2009 issued in U.S. Appl. No. 11/805,356.
US Office Action dated Apr. 8, 2010 issued in U.S. Appl. No. 11/805,356.
US Notice of Allowance and Allowed Claims dated Jul. 26, 2010 issued in U.S. Appl. No. 11/805,356.
US Office Action dated Sep. 6, 2006 issued in U.S. Appl. No. 10/869,474.
US Office Action dated Feb. 9, 2007 issued in U.S. Appl. No. 10/869,474.
US Final Office Action dated Jun. 28, 2007 issued in U.S. Appl. No. 10/869,474.
US Notice of Allowance dated Jul. 26, 2007 issued in U.S. Appl. No. 10/869,474.
US Office Action dated Mar. 17, 2008 issued in U.S. Appl. No. 11/893,490.
US Office Action dated Aug. 8, 2008 issued in U.S. Appl. No. 11/893,490.
US Office Action (*Ex Parte Quayle*) dated Jan. 27, 2009 issued in U.S. Appl. No. 11/893,490.
US Notice of Allowance dated May 4, 2009 issued in U.S. Appl. No. 11/893,490.
US Office Action dated Oct. 15, 2010 issued in U.S. Appl. No. 12/497,322.
US Notice of Allowance and Allowed Claims dated Mar. 11, 2011 issued in U.S. Appl. No. 12/497,322.
US Office Action, dated Dec. 12, 2008, issued in U.S. Appl. No. 11/369,658.
US Office Action, dated Jul. 8, 2009, issued in U.S. Appl. No. 11/369,658.
US Final Office Action, dated Mar. 18, 2010, issued in U.S. Appl. No. 11/369,658.
US Office Action dated Nov. 20, 2009 issued in U.S. Appl. No. 11/710,652.
US Final Office Action dated Apr. 15, 2010 issued in U.S. Appl. No. 11/710,652.
US Office Action dated Aug. 5, 2010 issued in U.S. Appl. No. 11/710,652.
US Notice of Allowance dated Nov. 24, 2010 issued in U.S. Appl. No. 11/710,652.
US Office Action dated Jul. 9, 2013 issued in U.S. Appl. No. 11/710,652.
US Notice of Allowance dated Oct. 25, 2013 issued in U.S. Appl. No. 11/710,652.

(56) References Cited

OTHER PUBLICATIONS

US Office Action dated Aug. 28, 2009 issued in U.S. Appl. No. 11/693,661.
US Office Action dated Feb. 24, 2010 issued in U.S. Appl. No. 11/693,661.
US Final Office Action dated Nov. 5, 2010 issued in U.S. Appl. No. 11/693,661.
US Office Action dated Dec. 31, 2008 issued in U.S. Appl. No. 11/693,617.
US Office Action dated Oct. 7, 2009 issued in U.S. Appl. No. 11/693,617.
US Office Action dated Jun. 10, 2010 issued in U.S. Appl. No. 11/693,617.
US Final Office Action dated Jan. 20, 2011 issued in U.S. Appl. No. 11/693,617.
US Office Action dated Sep. 16, 2011 issued in U.S. Appl. No. 11/693,617.
US Notice of Allowance dated Jan. 9, 2012 issued in U.S. Appl. No. 11/693,617.
US Office Action dated Jan. 12, 2011 issued in U.S. Appl. No. 12/082,496.
US Final Office Action dated Aug. 4, 2011 issued in U.S. Appl. No. 12/082,496.
US Notice of Allowance dated Oct. 26, 2011 issued in U.S. Appl. No. 12/082,496.
US Notice of Allowance dated Apr. 10, 2012 issued in U.S. Appl. No. 12/631,691.
US Notice of Allowance, dated Jan. 24, 2012, issued in U.S. Appl. No. 12/631,709.
US Notice of Allowance, dated May 15, 2013, issued in U.S. Appl. No. 13/546,937.
US Office Action dated Feb. 7, 2014 issued in U.S. Appl. No. 13/967,832.
US Office Action dated Feb. 7, 2014 issued in U.S. Appl. No. 13/494,836.
Chinese First Office Action dated Jan. 24, 2014 issued in Application No. 201010569747.0.
Hoffman et al., (May/Jun. 1995) "Plasma-enhanced Chemical Vapor Deposition of Silicon, Germanium, and Tin Nitride Thin Films from Metalorganic Precursors", *J. Vac. Sci. Technol.* A 13(3):820-824.
International Sematech Ultra Low-K Workshop. (2002) 1 page.
Jones et al., (Nov. 30, 2001) "Silicon Containing Polymers: The Science and Technology of Their Synthesis and Applications," *Springer*, p. 705.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.
Maeda et al. (Sep. 1989), "A Low-Permittivity Interconnection Using an SiBN Interlayer," *IEEE Transactions on Electron Devices* 36(9).
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Szekeres, A. et al. (2006) "Plasma-assisted chemical vapor deposited silicon oxynitride as an alternative material for gate dielectric in MOS devices," *Microelectronics Journal 37*, pp. 64-70.
Wang et al. (2003) "Reduction of Oxygen Plasma Damage by Postdeposition Helium Plasma Treatment for Carbon-Doped Silicon Oxide Low Dielectric Constant Films," *Electrochemical and Solid-State Letters*, 6 (1) F1-F3.
Wrobel et al., "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 2010, vol. 24, pp. 201-207.
Wu et al. (Oct. 17-19, 2006), "Ultra Low k Dielectrics Prepared by PECVD Using a Single-Precursor and Treated by UV Assisted Thermal Processing," *Advanced Metallization Conference (AMC) 2006*, pp. 1-6, San Diego, CA.

Varadarajan, Bhadri, U.S. Appl. No. 14/961,637, filed Dec. 7, 2015 entitled "Method to Obtain SiC Class of Films of Desired Composition and Film Properties."
Tan et al., U.S. Appl. No. 14/692,627, filed Apr. 21, 2015 entitled "Gap Fill Using Carbon-Based Films."
U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Sep. 15, 2015 issued in U.S. Appl. No. 14/062,648.
U.S. Office Action dated Nov. 2, 2015 issued in U.S. Appl. No. 14/616,435.
US Notice of Allowance dated May 30, 2014 issued in U.S. Appl. No. 13/967,832.
US Notice of Allowance dated Sep. 5, 2014 issued in U.S. Appl. No. 13/967,832.
US Final Office Action dated Aug. 21, 2014 issued in U.S. Appl. No. 13/494,836.
US Office Action dated May 5, 2015 issued in U.S. Appl. No. 13/494,836.
US Final Office Action dated Nov. 16, 2015 issued in U.S. Appl. No. 13/494,836.
Chinese Second Office Action dated Aug. 14, 2014 issued in CN Application No. 201010569747.0.
Chinese Third Office Action dated Jan. 13, 2015 issued in CN Application No. 201010569747.0.
Japanese Office Action dated Jul. 29, 2014 issued in JP Application No. 2010-256165.
Taiwan Notice of Allowance and Search Report [with translation] dated Jul. 8, 2015 issued in Application No. TW 099140866.
Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.
Grubbs et al. (May/Jun. 2006) "Attenuation of hydrogen radicals traveling under flowing gas conditions through tubes of different materials," *J. Vac. Sci. Technol. A*, 24(3):486-496.
Hatanaka et al., (2000) "Experiments and analyses of SiC thin film deposition from organo-silicon by a remote plasma method," *Thin Solid Films*, 368:287-291.
Huran, J., et al., (2004) "RBS study of amorphous silicon carbide films deposited by PECVD," *Czechoslovak Journal of Physics*, 54(Suppl. C):C1006-C1010.
"Radical (chemistry)" From Wikipedia, the free encyclopedia, [downloaded at http://en.wikipedia.org/wiki/Radical_(chemistry) on Sep. 23, 2015], 11 pages.
Wróbel et al. (2001) "Oligomerization and Polymerization Steps in Remote Plasma Chemical Vapor Deposition of Silicon-Carbon and Silica Films from Organosilicon Sources," *Chem. Mater*, 13(5): 1884-1895.
Xu, Ying-Yu, et al., (1999) "Preparation of SiC Thin Film Using Organosilicon by Remote Plasma CVD Method," *Mat. Res. Soc. Symp. Proc.*, 544:185-189.

\* cited by examiner

OXYGEN-CONTAINING CERAMIC HARD MASKS AND ASSOCIATED WET-CLEANS

CROSS REFERENCE TO RELATED APPLICATION

This application claims the benefit of U.S. Provisional Patent Application No. 61/738,599 filed Dec. 18, 2012, titled OXYGEN-CONTAINING CERAMIC HARD MASKS AND ASSOCIATED WET-CLEANS, incorporated by reference herein in its entirety and for all purposes.

FIELD OF THE INVENTION

This invention relates to hard mask films for use in semiconductor processing. The invention also relates to methods and apparatus for forming and removing such films.

BACKGROUND OF THE INVENTION

Hard mask films are commonly used as sacrificial layers during lithographic patterning, e.g., during trench and/or via formation in a Damascene process. In Damascene processing, a hard mask film is typically deposited onto a layer of dielectric that needs to be patterned. A layer of photoresist is deposited over the hard mask film (with an optional antireflective layer deposited between the hard mask and the photoresist), and the photoresist is patterned as desired. After the photoresist is developed, the exposed hard mask film below the pattern is removed, and the exposed dielectric is etched such that recessed features of required dimensions are formed. The remaining hard mask serves to protect those portions of dielectric that need to be preserved during the etching process. Therefore, the hard mask material should have a good etch selectivity relative to the dielectric. Reactive ion etching (RIE) which uses halogen-based plasma chemistry is typically employed for dielectric etching.

The etched recessed features are then filled with a conductive material, such as copper, forming the conductive paths of an integrated circuit. Typically, after the recessed features are filled, the hard mask material is completely removed from the partially fabricated semiconductor substrate.

Hard mask layers are becoming more common in both front-end-of-line (FEOL) back-end-of-line (BEOL) patterning schemes. For example, hard mask films are often used as an aid in critical patterning applications for BEOL inter-level dielectric (ILD) materials. These hard mask films should have a high etch selectivity with respect to the ILD material, be compatible with basic lithography processes and be capable of removal without damaging the underlying ILD layer. Currently, TiN is often used as a hard mask in BEOL low-k dielectric applications because of its very high etch selectivity relative to the low-k dielectric that facilitates its eventual removal. However, there are a number of integration issues associated with such a metal-based hard masks: (a) polymer formed to protect the sidewall of low-k ILD during the etch process reacts with metal-based hard mask to form a metal polymer residue that causes defect issues; (b) high compressive stress in the TiN coupled with weak mechanical properties of the low-k dielectric can lead to a buckling phenomenon, and (c) the need for a different etch platform for hard mask compared to underlayers, which can further increase cost.

SUMMARY

Hard mask films with improved properties and their methods of fabrication and removal are provided. In lithographic applications, hard mask materials with low stress are needed because materials with highly compressive or tensile stresses lead to buckling or delamination of the hard mask film on the substrate, and, consequently, to poor pattern alignment in lithography. In addition to low stress, hard mask materials should have high hardness and/or high Young's modulus in order to adequately protect the underlying material, since hardness and modulus typically correlate well with high etch selectivity.

PECVD based ceramic hard masks tend to be chemically inert, thereby having very low removal rates through wet-chemistry or chemical mechanical polishing (CMP). However, some ceramics, in addition to being very hard, can be hydrophilic in nature and may be constructed to enable wet-clean and CMP chemistries. Oxygen-containing ceramic hard mask materials formed using PECVD deposition and which are removed by wet-cleans after the pattern transfer steps are provided. These hard mask materials have low stress and high selectivity to low-k dielectric materials that enable advanced patterning, while at the same time being removable by wet-clean chemistries without the need for CMP, thereby greatly facilitating the integration of these films.

In one aspect, a method of forming an oxygen-containing ceramic hard mask film on a semiconductor substrate involves receiving a semiconductor substrate in a plasma-enhanced chemical vapor deposition (PECVD) process chamber and depositing forming by PEVCD on the substrate an oxygen-containing ceramic hard mask film, the film being etch selective to low-k dielectric and copper, resistant to plasma dry-etch and removable by wet-etch. The method may further involve removing the oxygen-containing ceramic hard mask film from the substrate with a wet etch. Specific process parameters are provided.

In another aspect, a partially fabricated semiconductor device includes a semiconductor device substrate, and an oxygen-containing ceramic hard mask film disposed on the substrate, the film being etch selective to low-k dielectric and copper, resistant to plasma dry-etch and removable by wet-etch.

In still another aspect, an apparatus for processing a hard mask film on a semiconductor substrate includes a plasma-enhanced chemical vapor deposition (PECVD) process chamber, a support in the process chamber for a semiconductor wafer substrate for holding the wafer substrate in position during hard mask deposition, and a controller with program instructions. The controller program instruction are for a process of receiving a semiconductor wafer substrate in a plasma-enhanced chemical vapor deposition (PECVD) process chamber, and forming by PEVCD on the substrate an oxygen-containing ceramic hard mask film, the film being etch selective to low-k dielectric and copper, resistant to plasma dry-etch and removable by wet-etch. The apparatus can further include a wet etch process chamber, and a controller with program instructions for a process of receiving the semiconductor wafer substrate with the oxygen-containing ceramic hard mask film formed thereon, and removing the oxygen-containing ceramic hard mask film from the substrate with a wet etch.

Advantageously, oxygen-containing ceramic films can be easily removed after patterning is completed by wet etch chemistries, without the need for CMP.

In some embodiments, an oxygen-containing ceramic hard mask film (such as any of the films described above) is deposited on a layer of low-k dielectric, e.g., a dielectric having a dielectric constant of less than about 3, such as less than about 2.8, in back-end processing. A layer of photoresist is typically deposited over the oxygen-containing ceramic hard mask (but not necessarily in direct contact with the hard mask, as antireflective layers may be deposited in between). Lithographic patterning is performed, in which recessed features (a via and/or a trench) are formed in the dielectric layer. After the patterning is completed and the features are filled with metal, the hard mask is removed by a wet etch process. In some embodiments the etch selectivity of the hard mask film relative to dielectric is at least about 8:1, referring to dry etch chemistry used to etch vias and/or trenches, which is typically an RIE process.

In other embodiments, a hard mask film (such as any of the films described above) is deposited on a layer of polysilicon in front-end processing and serves to protect polysilicon during various processing steps. In some embodiments, the hard mask material is not removed and will remain in the manufactured device.

These and other features and advantages of the present invention will be described in more detail below with reference to the associated drawings.

DETAILED DESCRIPTION OF SPECIFIC EMBODIMENTS

Introduction and Overview

Figure 1A:
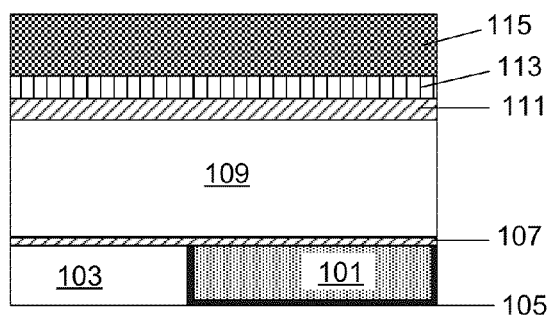
FIGS. 1A-1K show cross-sectional depictions of device structures created during an illustrative back-end lithographic process in semiconductor device fabrication, using hard masks provided herein.

Oxygen-containing ceramic hard mask films for back-end and front-end semiconductor processing applications are provided. The provided ceramic hard masks include a combination of oxygen with elements such as boron, phosphorous, germanium, carbon, silicon, nitrogen and hydrogen. Hard masks in accordance with the invention are generally hydrophilic in nature. Boron doped carbide-based hard mask materials are one preferred species of the hard masks of the present invention. The tri-valent nature of boron (along with empty pi-orbital in its typical bonding state), readily facilitates oxidation of its network structure. In particular embodiments, oxygen-containing ceramic hard mask materials in accordance with the present invention have at least 5% oxygen. In oxygen containing boron doped carbide-based hard mask materials, the ratio of B:C generally does not exceed 1:1, and the concentration (percentage) of oxygen is generally constrained by the boron concentration.

The oxygen-containing ceramic hard masks may be wet-cleaned using etch chemistries that include, for example, an oxidant and strong acid or strong base compounds, or water, either in combination with corrosion inhibitors. These wet-cleans are very selective for the oxygen-containing ceramic hard masks with respect to low-k materials and copper.

Suitable wet clean chemistries can have a pH ranging from 2 to 13, for example, some suitable etch chemistries have a pH between 6 and 10. These wet-cleans can be done at temperature from about 20° C. to 100° C.

The oxidant can be a peroxide source, such as hydrogen peroxide, which can be used in a concentration of about 5 to 50%. The base compounds can be chosen from ammonium hydroxide, tetramethyl ammonium hydroxide, potassium hydroxide, sodium hydroxide, hydroxylamines, amines, tetraalkylammonium hydroxide, for example. The corrosion inhibitor can be chosen from families of amino acids including glycine or alanine, triazoles, thiol-based-triazoles, and imidazole, for example.

Therefore, this invention provides oxygen-containing ceramic hard-mask materials and wet-cleans to facilitate integration of the ceramic hard mask processing solution in both logic and memory applications. The chemical composition of the hard mask (i.e., level of oxygen incorporation) can be tailored to facilitate selective removal in a specific wet etch chemistry while preserving the desired film properties of the hard mask.

The provided films possess high etch selectivity relative to dielectrics (such as relative to dielectrics having dielectric constant of 3.0 and less, such as 2.8 and less, or 2.4 and less) in chemistries that are used for via and/or trench etching. Sample etch chemistries include an RIE using plasma formed in a process gas comprising $C_xF_y$, (e.g., $CF_4$), inert gas (e.g., Ar) and an oxidizer (e.g., $O_2$). Other dry etches, such as plasma etching with a process gas comprising $Cl_2$ and $N_2$ may be used. Etch selectivities of at least about 5:1, such as at least about 8:1 (i.e. hard mask material is etched at least 8 times slower than the dielectric) can be obtained in some embodiments.

The dielectrics that can be etched in the presence of exposed hard mask materials provided herein include silicon oxide, carbon-doped silicon oxide (SiCOH), TEOS (tetraethyl orthosilicate)-deposited oxide, various silicate glasses, hydrogen silsesquioxane (HSQ), methylsilsesquioxane (MSQ), as well as porous and/or organic dielectrics, which include polyimides, polynorbornenes, benzocyclobutene, etc. The provided hard masks are most advantageously used for patterning of mechanically weak organic and/or porous dielectrics having dielectric constant of 2.8 and less, such as 2.4 and less.

Hard mask materials described herein generally can be deposited using a variety of methods, including CVD-based methods and PVD-based methods. PECVD is a particularly preferred deposition method. Suitable PECVD apparatuses include the SEQUEL® and VECTOR® tools available from Lam Research Corporation, Fremont, Calif. Low frequency radio frequency (RF) power refers to RF power having a frequency between 100 kHz and 2 MHz. A typical frequency range for LF plasma source is between about 100 kHz to 500 kHz, e.g., 400 kHz frequency may be used. During deposition of the hard mask layers, LF power density typically ranges at about 0.001-1.3 W/cm$^2$, in particular embodiments, at about 0.1-0.7 W/cm$^2$. HF power typically ranges at about 0.001-1.3 W/cm$^2$ and in particular embodiments, at about 0.02-0.28 W/cm$^2$. High frequency power refers to RF power with a frequency greater than 2 MHz. Typically HF RF frequency lies in the range of between about 2 MHz-30 MHz. A commonly used HF RF values include 13.56 MHz and 27 MHz In certain embodiments, the deposition of hard masks involves setting LF/HF power ratio of at least about 1, such as at least about 1.5, e.g., at least about 2.

During PECVD deposition, the reactant gas or vapor is provided to the processing chamber typically at a flow rate typically ranging from about 1000 sccm to about 10000 sccm, and using substrate pedestal temperatures ranging from about 20° C. to about 500° C., preferably from about 200° C. to about 450° C. In some embodiments, temperatures lower than about 400° C. (e.g., from about 200° C. to about 400° C.) are preferable for hard mask deposition. Pressure may range from about 10 mTorr to about 100 Torr, preferably from about 0.5 Torr to 5 Torr. It is understood that flow rates of precursors can vary depending on the size of the substrate and chamber size.

The oxygen-containing ceramic hard masks may be wet-cleaned using etch chemistries that include, for example, an oxidant and strong acid or strong base compounds, or water, particularly hot (e.g., greater than 60° C., for example about 100° C.) water, either in combination with corrosion inhibitors, for example amino acids including glycine or alanine, triazoles, thiol-based-triazoles, and imidazole. These wet-cleans are very selective for the oxygen-containing ceramic hard masks with respect to low-k materials and copper.

Use in Back-End Processing

Figure 3:
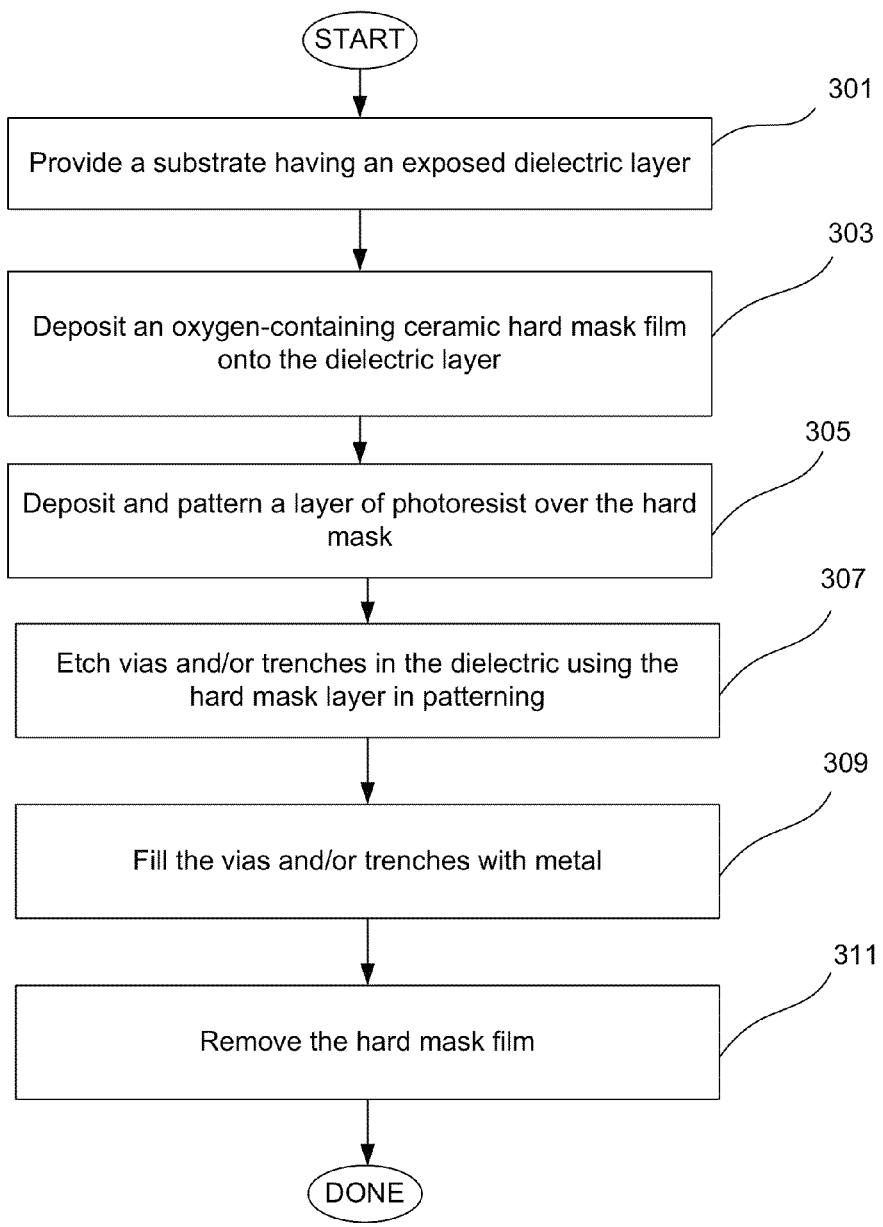
FIG. 3 is a process flow diagram for a back-end lithographic process suitable for use with hard masks provided herein.

Provided films can be used in a variety of hard mask applications. An exemplary use of hard mask films in back-end processing is illustrated by structures shown in FIGS. 1A-1K, and by the process flow diagram shown in FIG. 3. Referring to the illustrative process flow of FIG. 3, the process starts in 301 by providing a substrate having an exposed dielectric layer. The substrate is typically a semiconductor (e.g., silicon) wafer having one or more layers of material (such as conductors or dielectrics) residing thereon. The exposed portion of the substrate contains a layer of dielectric that needs to be patterned with vias and trenches. The hard masks provided herein can be generally used in patterning of a variety of dielectric materials listed in the previous section. It is particularly advantageous to use provided hard mask materials for patterning ULK dielectrics with dielectric constant of 2.8 and less, such as 2.4 and less, including mechanically less strong porous and organic dielectrics. As explained above, provided hard masks, in many embodiments, possess very low stress, and can significantly reduce buckling and poor pattern alignment, which typically occurs when high-stress hard mask materials are used in patterning of mechanically weak ULK dielectrics. It is noted that in some embodiments, a buffer layer of mechanically stronger material is used between the fragile ULK dielectric and the hard mask. Thus, in some embodiments, the provided substrate has an exposed buffer layer (such as a mechanically stronger dielectric) residing on a layer of ULK material. For example, a buffer layer comprising a dielectric having k of greater than 2.8 can reside on a mechanically less strong dielectric with a lower dielectric constant. For example, a buffer layer comprising a material selected from the group consisting of carbon-doped silicon oxide (SiCOH), TEOS (tetraethyl orthosilicate)-deposited oxide, various silicate glasses, hydrogen silsesquioxane (HSQ), and methylsilsesquioxane (MSQ), can reside on a porous and/or organic dielectric, which may include polyimides, polynorbornenes, benzocyclobutene, etc. The ULK dielectrics and buffer layer dielectrics can be deposited, for example, by spin-on methods or by PECVD. In some embodiments the dielectric and/or buffer layer are deposited in the same PECVD module as the hard mask layer deposited thereon. This provides an additional advantage over titanium nitride hard masks, which require PVD module for deposition.

In operation 303 the oxygen-containing ceramic hard mask material is deposited onto the dielectric layer (or onto the buffer layer, which typically is also a dielectric) in a PECVD process chamber. Next, one or more antireflective layers, such as bottom anti-reflective coating (BARC) are optionally deposited, followed by deposition of photoresist over the hard mask in operation 305. It is noted that photoresist is not necessarily in direct contact with the hard mask material, since one or more antireflective layers typically reside between the hard mask and photoresist. Next, in operation 307 vias and/or trenches are etched in the dielectric layer using the deposited hard mask, and lithographic patterning. Suitable etches include RIE described in the previous section, where the dielectric material is etched in the presence of exposed hard mask having high etch selectivity for the etch.

A variety of lithographic schemes, which may include deposition and removal of multiple photoresist layers, deposition of filler layers, etc., may be used to form the desired pattern of recessed features. These lithographic schemes are known in the art, and will not be described in detail. A scheme, which defines a trench first and then forms a partial via is used as an illustration in FIGS. 1A-1K. It is understood, however, that back-end processing can use a variety of other schemes. After the vias and/or trenches are formed, the vias and/or trenches are filled with metal (such as electrodeposited copper or its alloy) in 309, and the hard mask film is removed in operation 311, by wet etch. In some embodiments, wet etch chemistries containing a peroxide (such as acidic slurries containing hydrogen peroxide, for example a piranha solution) are preferred for hard mask removal. In other embodiments, the wet etch may be performed with water, particularly hot (e.g., greater than 60° C., for example about 100° C.) water. In either case, the wet etch chemistry can also include a corrosion inhibitor to prevent corrosion of the metal (e.g., copper) into contact with which the wet etch chemistry comes during operation 311. In some cases, water is preferred as the wet etchant since the corrosion inhibitor is not degraded by the water to the extent that it can be in the more aggressive acidic or basics wet etch chemistries.

FIGS. 1A-1K show schematic cross-sectional views of a partially fabricated semiconductor substrate during back-end processing, according to one illustrative processing scheme. FIG. 1A shows a portion of semiconductor substrate (underlying silicon layer and active devices are not shown) having a copper layer 101 embedded in a first layer of dielectric 103 (e.g., a ULK dielectric), where a diffusion barrier layer 105 (e.g., including Ta, Ti, W, TaN$_x$, TiN$_x$, WN$_x$ or combinations thereof) resides at an interface between the dielectric and copper. A dielectric diffusion barrier layer (also known as etch-stop layer) 107, such as silicon nitride or nitrogen-doped silicon carbide layer resides on top of copper 101 and dielectric 103. A second dielectric layer 109 (e.g., a spin-on or PECVD-deposited ULK dielectric) resides on top of the dielectric diffusion barrier layer 107. Because dielectric layer 109 can be mechanically weak, and can be damaged during hard mask deposition, a mechanically stronger dielectric buffer layer 111, e.g., TEOS dielectric or carbon-doped silicon oxide (SiCOH) is deposited onto the layer 109. The hard mask layer 113, which includes a high-hardness material described herein, is deposited onto the buffer layer 111 by PECVD. Unlike dielectric diffusion barrier layer 107, the oxygen-containing ceramic hard mask layer 113 is deposited on a surface that does not include exposed metal. A layer of photoresist 115 is deposited over the hard mask 113 by a spin-on method. Typically one or more antireflective layers are deposited immediately between the hard mask and the photoresist. These layers are not shown to preserve clarity.

Figure 1B:
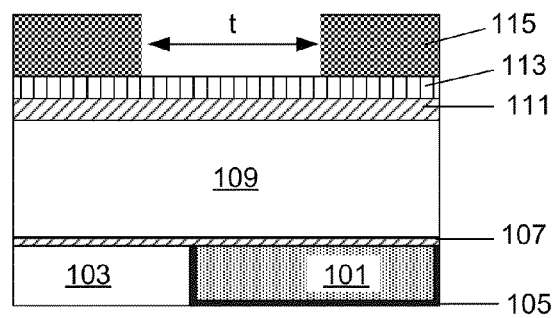
Figure 1C:
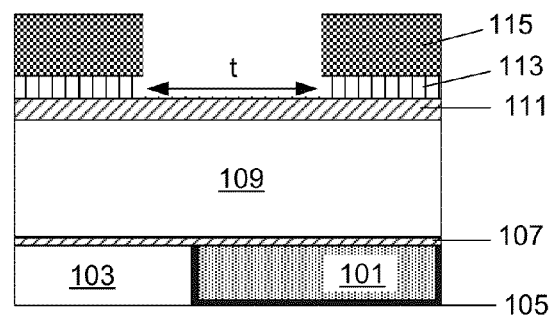
Figure 1D:
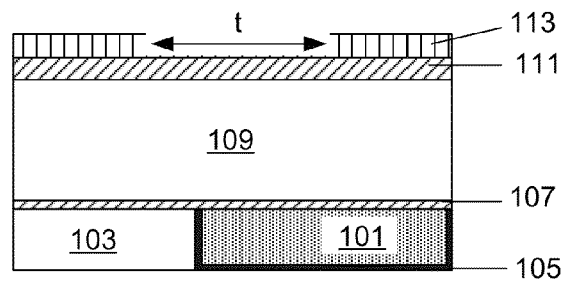
Figure 1E:
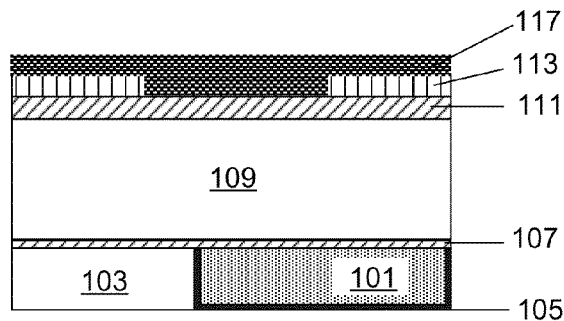
Figure 1F:
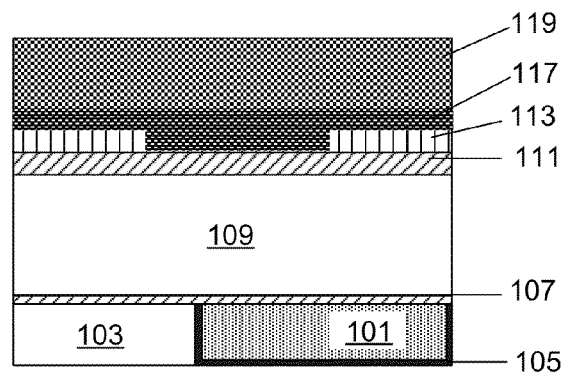
Figure 1G:
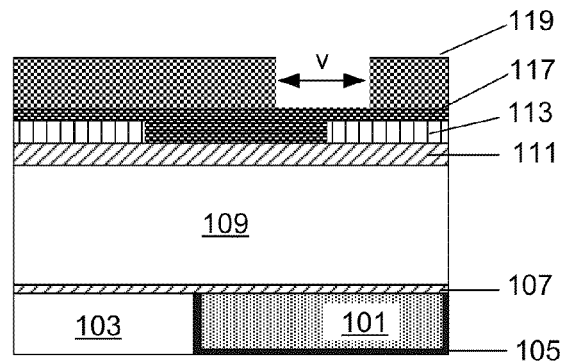
Figure 1H:
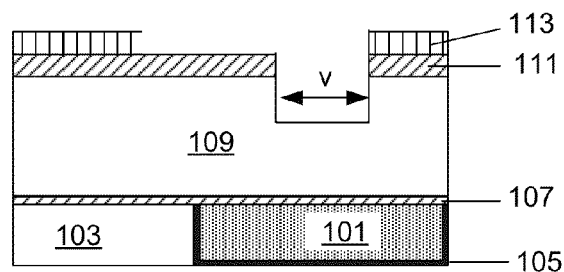
Figure 1I:
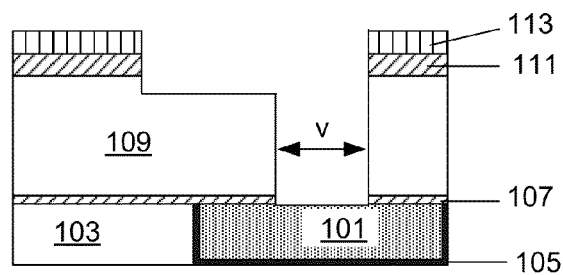
Figure 1J:
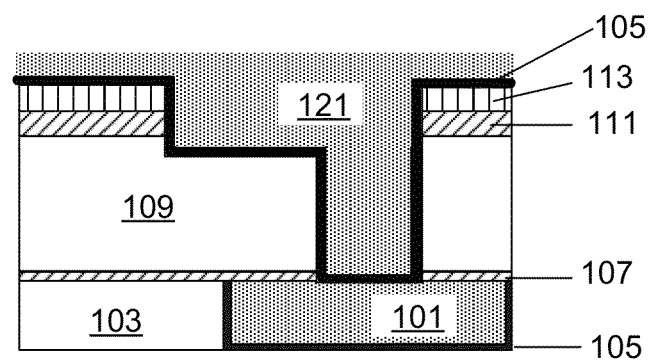
Figure 1K:
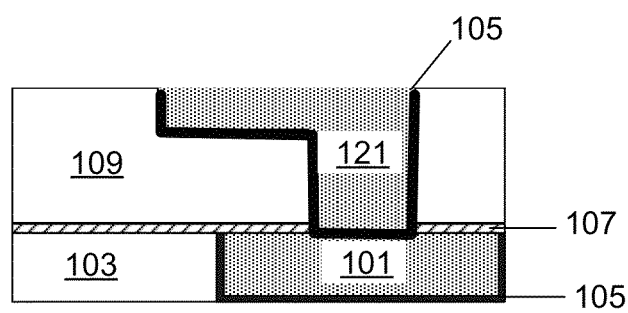

After the photoresist 115 has been deposited, it is patterned using standard lithographic techniques, to form an opening having width t, which will be used to form the future trench. The resulting structure with patterned photoresist layer 115 is shown in FIG. 1B. Next, the hard mask layer 113 residing below the removed photoresist, is opened (etched), forming a pattern of exposed dielectric 111, as shown in FIG. 1C. The remaining hard mask will serve to protect the dielectric during photoresist removal and subsequent dielectric etch. Next, photoresist layer 115 is removed from the structure, e.g., by ashing, and a structure having exposed patterned hard mask 113 is formed. At this stage, patterning to form a via is initiated. To pattern a via, a filler layer 117, which may comprise an easily removable dielectric, such as HSQ or MSQ, is deposited over the surface of the structure, filling the opening in the hard mask, as shown in FIG. 1E. Next, a second layer of photoresist 119 is deposited over the filler layer 117 (with optional antireflective layers in between), to form the structure shown in FIG. 1F. The photoresist 119 is then patterned to form an opening having width V, which will be used in formation of a via, as shown in structure 1G. Next, the hard mask below the photoresist pattern is removed, and a via is partially etched in the dielectric 109, e.g., using RIE. The photoresist 119, and the filler layer 117 are removed, forming a structure having a partially etched via and a defined trench, shown in FIG. 1H. Next, etching of dielectric layers 111 and 109 continues until the via reaches the etch stop layer 107, which is then subsequently etched through to expose metal layer 101 at the bottom of the via, as shown in FIG. 1I. A layer of diffusion barrier material 105 is then conformally deposited by PVD to line the substrate within the recessed features and in the field region. This is followed by filling the recessed features with metal 121 (e.g., electrodeposited copper or its alloy) typically with some overburden in the field, providing a structure shown in FIG. 1J. Next, metal overburden, diffusion barrier material 105, hard mask layer 113, and dielectric buffer layer 111 are removed from the field region of the structure forming a partially fabricated device having a metal interconnect residing in low-k dielectric layer 109, as shown in FIG. 1K. In other processing schemes, the buffer layer 111, will not be removed and will remain on the substrate.

As further described below, removal of the oxygen-containing ceramic hard mask in accordance with the present invention is accomplished by wet etch, without the need for CMP.

The processing scheme which involves formation of a partial via, as shown in FIGS. 1A-1K illustrates one possible patterning scheme for low-k dielectric. Hard mask materials provided herein can be used in a variety of other processing schemes, including both via-first and trench-first schemes.

Use in Front-End Processing

Another illustrative use of provided oxygen-containing ceramic hard masks is protection of polysilicon during front-end processing. Polysilicon is widely used during formation of active devices (e.g., transistors) on semiconductor wafers. In some embodiments, provided oxygen-containing ceramic hard mask materials are deposited onto polysilicon, and are used to protect polysilicon during various processing operations used in active device fabrication. Notably, in front-end processing in many embodiments, the provided hard mask layers are not sacrificial and remain in the final device residing in contact with polysilicon.

Figure 2A:
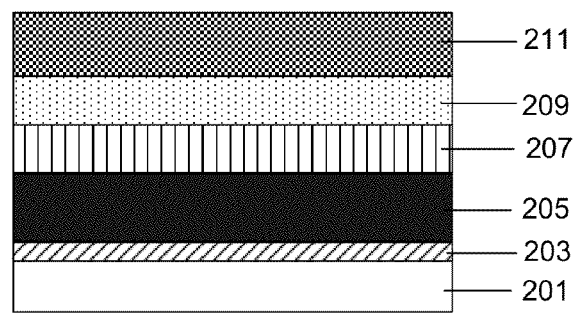
FIGS. 2A-2E show cross-sectional depictions of device structures created during an illustrative front-end lithographic process in semiconductor device fabrication using hard masks provided herein.
Figure 2B:
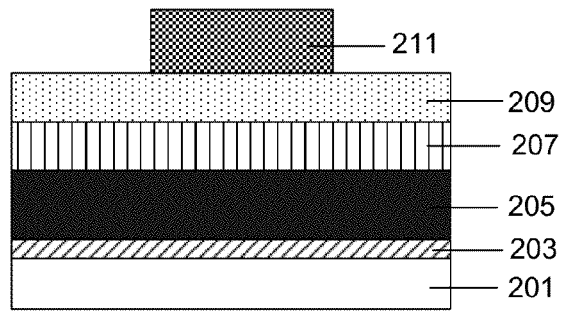
Figure 2C:
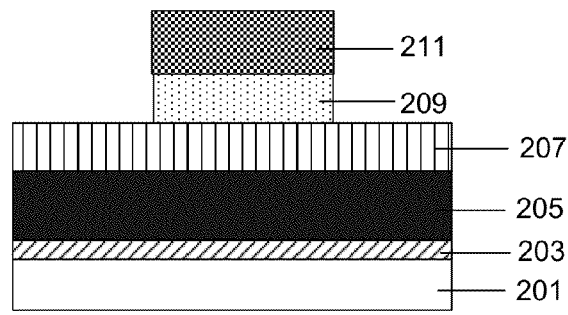
Figure 2D:
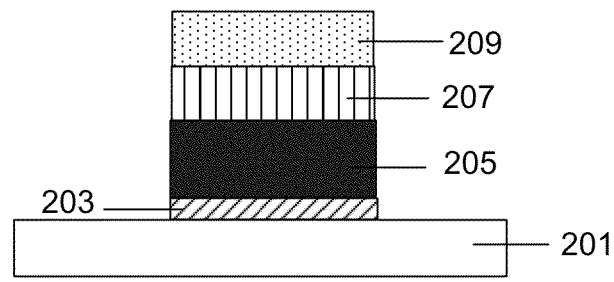
Figure 4:
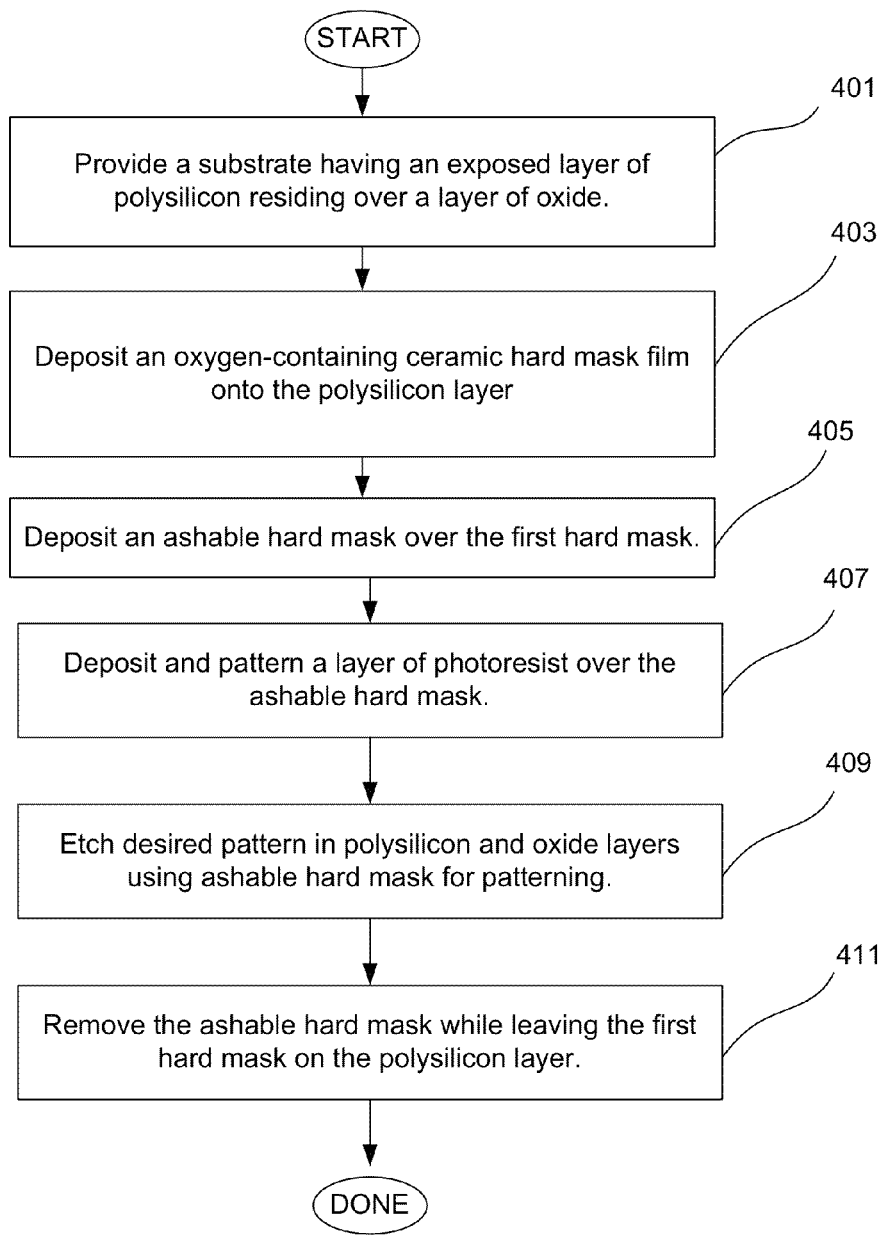
FIG. 4 is a process flow diagram for a front-end lithographic process suitable for use with hard masks provided herein.

An illustrative front-end processing scheme is shown in the process flow diagram of FIG. 4, and is further illustrated by schematic cross-sectional views of partially fabricated structures shown in FIGS. 2A-2E. Referring to FIG. 4, the process starts in 401, which provides a substrate having an exposed layer of polysilicon residing over layer of an oxide (e.g., silicon oxide, hafnium oxide, etc.). In other embodiments, the polysilicon may reside over different active layers. The oxide typically resides on a layer of single-crystal silicon. In order to pattern oxide and polysilicon layers, two hard mask layers are deposited over the polysilicon layer. The first hard mask is deposited directly onto the layer of polysilicon and is an oxygen-containing ceramic hard mask as described herein, as shown in operation 403. The hard mask is deposited by a CVD technique, more preferably by PECVD, as further described herein. Next, an ashable hard mask (e.g., a hard mask consisting essentially of carbon (with hydrogen optionally present)) is deposited over the first hard mask in operation 405. The ashable hard mask may also be deposited by a CVD technique, such as by PECVD deposition using a hydrocarbon precursor. Next, a layer of photoresist is deposited over the ashable hard mask and the photoresist is patterned as desired, as shown in operation 407. One or more antireflective layers may be optionally deposited between the ashable hard mask and the photoresist, which are not shown to preserve clarity. An illustrative structure having an unpatterned photoresist is illustrated in FIG. 2A, where layer 201 is a layer of single-crystal silicon. The layer 203, residing on the silicon layer 201 is a layer of oxide. The layer 205 on top of oxide layer 203 is a layer of polysilicon. A hard mask material described herein, 207, resides directly on top of polysilicon 205, and an ashable hard mask (e.g., a carbon hard mask) 209 resides over the first hard mask layer 207. A layer of photoresist 211 resides over the ashable hard mask 209 (optional antireflective layers in between are not shown). The structure, obtained after photoresist patterning is shown in FIG. 2B, which illustrates that photoresist is removed at two locations, leaving a portion in-between.

Referring again to FIG. 4, the process follows in operation 409, by etching a desired pattern in polysilicon and oxide layers using the ashable hard mask for patterning. This is illustrated by structures 2C-2E. In structure 2C, the ashable hard mask layer 209 is opened (etched) at the portions exposed after photoresist patterning. Next, the photoresist 211 is removed completely, and first hard mask layer 207, the polysilicon layer 205 and the oxide layer 203 are etched at the portions that are not protected by the ashable hard mask layer 209, providing a structure shown in FIG. 2D.

Figure 2E:
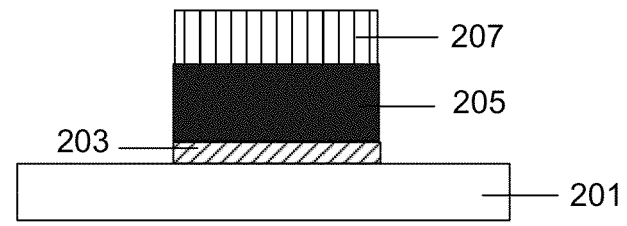

Referring again to FIG. 4, in operation 411, the ashable hard mask is removed, e.g., by oxygen plasma treatment, while leaving the first oxygen-containing ceramic hard mask layer on the polysilicon layer. The resulting structure is shown in FIG. 2E. The hard mask layer 207, can be retained during subsequent front-end processing and can serve to protect polysilicon during a variety of subsequent operations, such as during implantation of dopants into the crystalline silicon. It is noted that the hard mask material in the described process sequence does not perform actual masking (which is accomplished by ashable hard mask 209) but is used mainly for protection of polysilicon. Depending on the integration scheme, the hard mask 207 may be used for masking in subsequent front-end operations, such as during dry or wet etching in cleaning, or during etching of an oxide performed to define a gate. The hard mask material may be eventually removed from the final device, or may remain in the device, depending on the integration scheme that is used.

The back-end and front-end applications illustrated above are provided as exemplary sequences, and it is understood that provided materials can be used in a variety of other processes where high-hardness materials are desired for protection of underlying layers.

Deposition and removal of suitable oxygen-containing ceramic hard mask materials will now be described in detail.

Oxygen-Containing Ceramic Hard Mask Film Deposition and Removal

In various embodiments, an oxygen-containing ceramic hard mask film is provided by deposition using PECVD apparatus. A suitable deposition process involves three reactive gases: $C_2H_2$, $CO_2$, and $B_2H_6$ and a carrier gas, He. The $C_2H_2$ and $B_2H_6$ form a boron carbide film. In an exemplary process, total reactant flow can be on the order of 10000 sccm, most of which is He. For a base, unoxidized film, the percentage of precursors relative to total flow can be: He/$C_2H_2$/$CO_2$/$B_2H_6$=86.5/10.8/0.0/2.7. Such a film has a composition based on RBS measurements of C/H/B=47.7/32.7/19.6 with a density of 1.21 atoms/$cm^3$. That base film can be modified to form oxygen-containing ceramic hard mask films in accordance with the present invention. In particular embodiments, oxygen-containing ceramic hard mask materials in accordance with the present invention have at least 5% oxygen. In oxygen containing boron doped carbide-based hard mask materials, the ratio of B:C generally does not exceed 1:1, and the concentration (percentage) of oxygen is generally constrained by the boron concentration.

Oxidation is provided by adding an oxidant, $CO_2$ for example, to the process gas flow. For example, a suitable process gas can include the following percentages of precursors relative to total process gas flow: about He 80-83%/$C_2H_2$ 10-11%/$CO_2$ 5-8%/$B_2H_6$ 2-3%; for example, about He 82%/$C_2H_2$ 10.5%/$CO_2$ 5%/$B_2H_6$ 2.5%; or for example He 80%/$C_2H_2$ 10%/$CO_2$ 7.5%/$B_2H_6$ 2.5%.

The oxygen-containing ceramic hard masks may be wet-cleaned using etch chemistries that include, for example, an oxidant and strong acid or strong base compounds, or water, particularly hot (e.g., greater than 60° C., for example about 100° C.) water, either in combination with corrosion inhibitors. In some embodiments, wet etch chemistries containing a peroxide (such as acidic slurries containing hydrogen peroxide, for example a piranha solution) are preferred for hard mask removal. In other embodiments, the wet etch may be performed with water, particularly hot (e.g., greater than 60° C., for example about 100° C.) water. In either case, the wet etch chemistry can also include a corrosion inhibitor to prevent corrosion of the metal (e.g., copper) into contact with which the wet etch chemistry comes during operation 311. In some cases, water is preferred as the wet etchant since the corrosion inhibitor is not degraded by the water to the extent that it can be in the more aggressive acidic or basics wet etch chemistries. These wet-cleans are very selective for the oxygen-containing ceramic hard masks with respect to low-k materials and copper.

As shown in the table below, as the amount of $CO_2$ added to the process is increased, increasing the concentration of oxygen in the resulting firm, there is a radical change in the manner in which the material etches in wet chemistry.

| % of Precursor of Total Flow | | | | Wet Etch Chemistry | Wet Etch Temperature (° C.) | Wet Etch Rate (A/min) |
| --- | --- | --- | --- | --- | --- | --- |
| He (%) | $C_2H_2$ (%) | $CO_2$ (%) | $B_2H_6$ (%) | — | | |
| 82.1 | 10.3 | 5.1 | 2.6 | 1:1 96% H2SO4:30% H2O2 | 65 | 476.7 |
| 82.1 | 10.3 | 5.1 | 2.6 | water | 60 | 1.8 |
| 82.1 | 10.3 | 5.1 | 2.6 | water | 100 | 4.1 |
| 80.0 | 10.0 | 7.5 | 2.5 | 1:1 96% H2SO4:30% H2O2 | 65 | 205.0 |
| 80.0 | 10.0 | 7.5 | 2.5 | water | 60 | 0.0 |
| 80.0 | 10.0 | 7.5 | 2.5 | water | 100 | 15.3 |

While the invention is not limited by any particular theory of operation, it is believed that the mechanism may be the following:

(1) $CO_2$ is a weak oxidizer decomposing in a plasma according to the endothermic reaction of the general form: $CO_2 \rightarrow CO + \frac{1}{2}O_2$.

(2) During the deposition process, the resulting oxygen radicals can attack carbon, boron, or hydrogen sites on the film surface.

(3) Oxidation of carbon sites is likely to produce CO which is a very stable gas in most commercial plasma systems; hence, some carbon in the deposited film will be etched away.

(4) Oxidation of boron sites is likely to produce B—OH groups as found in Boric acid $H_3BO_3$ or $B(OH)_3$, which is a solid and will remain in the film.

(5) Oxidation of hydrogen sites will produce unstable hydroxyl or $H_2O$ which may be ionized and further oxidize other carbon or boron sites.

In summary, the $CO_2$ likely removes a portion of the carbon and hydrogen while at the same time oxidizing the boron. For a given process, adding more $CO_2$ will generally imply that more oxidation will occur until saturation is reached. Assuming the process is well below saturation, it is believed that the 7.5% (medium O doping) process should have more B—OH than the 5% (low O-doping) process. The observation that the film becomes increasingly water soluble at high temperatures supports this conclusion noting that boric acid exhibits similar behavior. The decrease in etch rate in the sulfuric acid/hydrogen peroxide solution similarly implies that more of the boron sites are oxidized and thus exposure to strong oxidizers have a limited effect.

Figure 5:
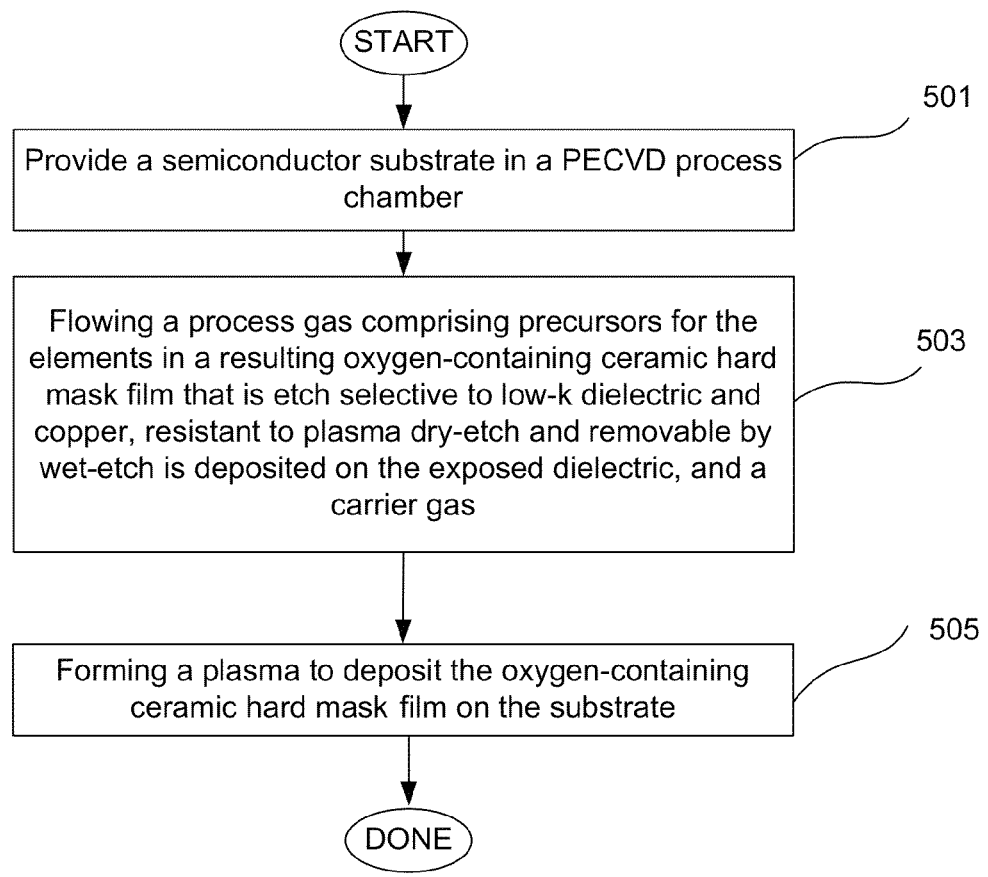
FIG. 5 is a process flow diagram for a method of depositing an oxygen-containing ceramic hard mask, in accordance with an embodiment provided herein.

An exemplary process flow diagram for formation of an oxygen-containing ceramic hard mask film is shown in FIG. 5. In operation 501, a semiconductor substrate (e.g., a substrate having an exposed dielectric layer or an exposed polysilicon layer) is provided into a PECVD process chamber. The PECVD process chamber contains inlets for introduction of precursors, and a plasma generator. In some embodiments, a dual-frequency RF plasma generator which has HF and LF generator components can be used.

An oxygen containing hard mask film is formed on the substrate, wherein the deposition includes 503 flowing a process gas into the chamber and forming a plasma. Suitable process gas flows include flowing a process gas comprising precursors for the elements in the resulting oxygen-containing ceramic hard mask film that is etch selective to low-k dielectric and copper, resistant to plasma dry-etch and removable by wet-etch is deposited on the exposed dielectric, and a carrier gas. For example, the process gas may contain a hydrocarbon-containing precursor, an oxygen-containing precursor, a boron-containing precursor, in addition to a carrier gas, such as $C_2H_2/CO_2/B_2H_6$/He. A plasma is formed 505 to deposit the oxygen-containing ceramic hard mask film on the substrate. In one example, dual frequency plasma, where HF RF frequency is about 13.56 MHz and LF RF frequency is 400 kHz is used. The HF power density in this example is about 0.04-0.2 W/cm$^2$, and LF power density is about 0.17-0.6 W/cm$^2$.

Figure 6:
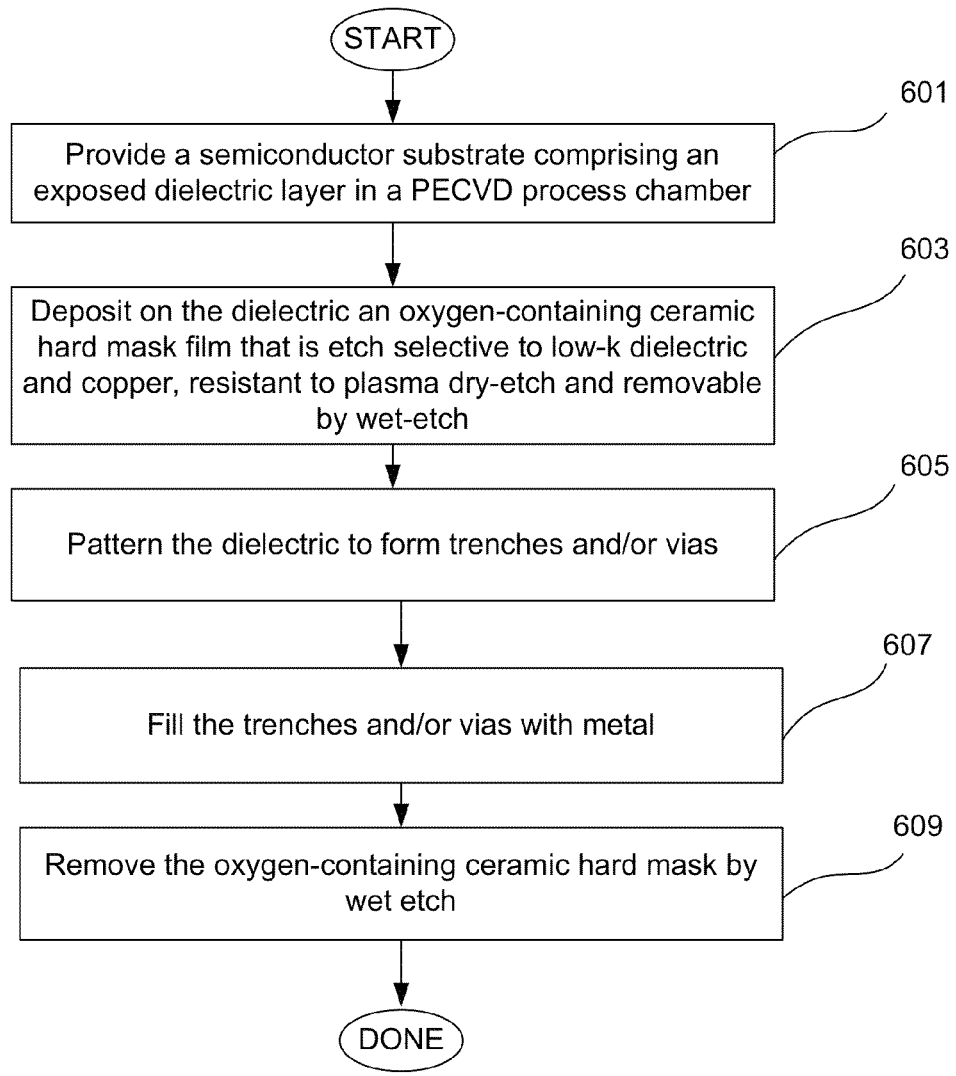
FIG. 6 is a process flow diagram for an exemplary processing method which employs oxygen-containing ceramic hard mask in accordance with an embodiment provided herein.

Referring to FIG. 6, an exemplary process flow for using an oxygen-containing ceramic hard mask in back-end processing is depicted. The process starts in 601 by providing a semiconductor substrate comprising an exposed dielectric layer in a PECVD process chamber. The dielectric layer may be, for example, an ultra-low k dielectric layer (e.g., with k less than about 2.8, such as less than about 2.4) or a buffer dielectric layer with higher dielectric constant.

In operation 603, an oxygen-containing ceramic hard mask film that is etch selective to low-k dielectric and copper, resistant to plasma dry-etch and removable by wet-etch is deposited on the exposed dielectric. The deposition is performed by flowing a process gas comprising appropriate precursors into the process chamber and forming a plasma. In some embodiments, particularly good film parameters are obtained when power density for LF plasma is greater than power density for HF plasma, e.g., at LF/HF power ratios of at least about 1.5, such as at least about 2.

After the film has been deposited, the dielectric is patterned in 605, to form trenches and/or vias, e.g., as was described with reference to FIGS. 1A-1K. Oxygen-containing ceramic hard mask films can serve as hard masks during dry etch of dielectric with RIE. After the vias and/or trenches have been formed in the dielectric, they are filled with metal in operation 607. Then the oxygen-containing ceramic hard mask is removed in 609 by wet etch, without CMP.

Apparatus

The hard mask materials described herein generally can be deposited in different types of apparatus, including CVD and PVD apparatuses. In a preferred embodiment, the apparatus is a PECVD apparatus which may include HFRF and LFRF power source. Examples of suitable apparatuses include SEQUEL® and VECTOR® tools commercially available from Lam Research Corporation, Fremont, Calif.

Figure 8:
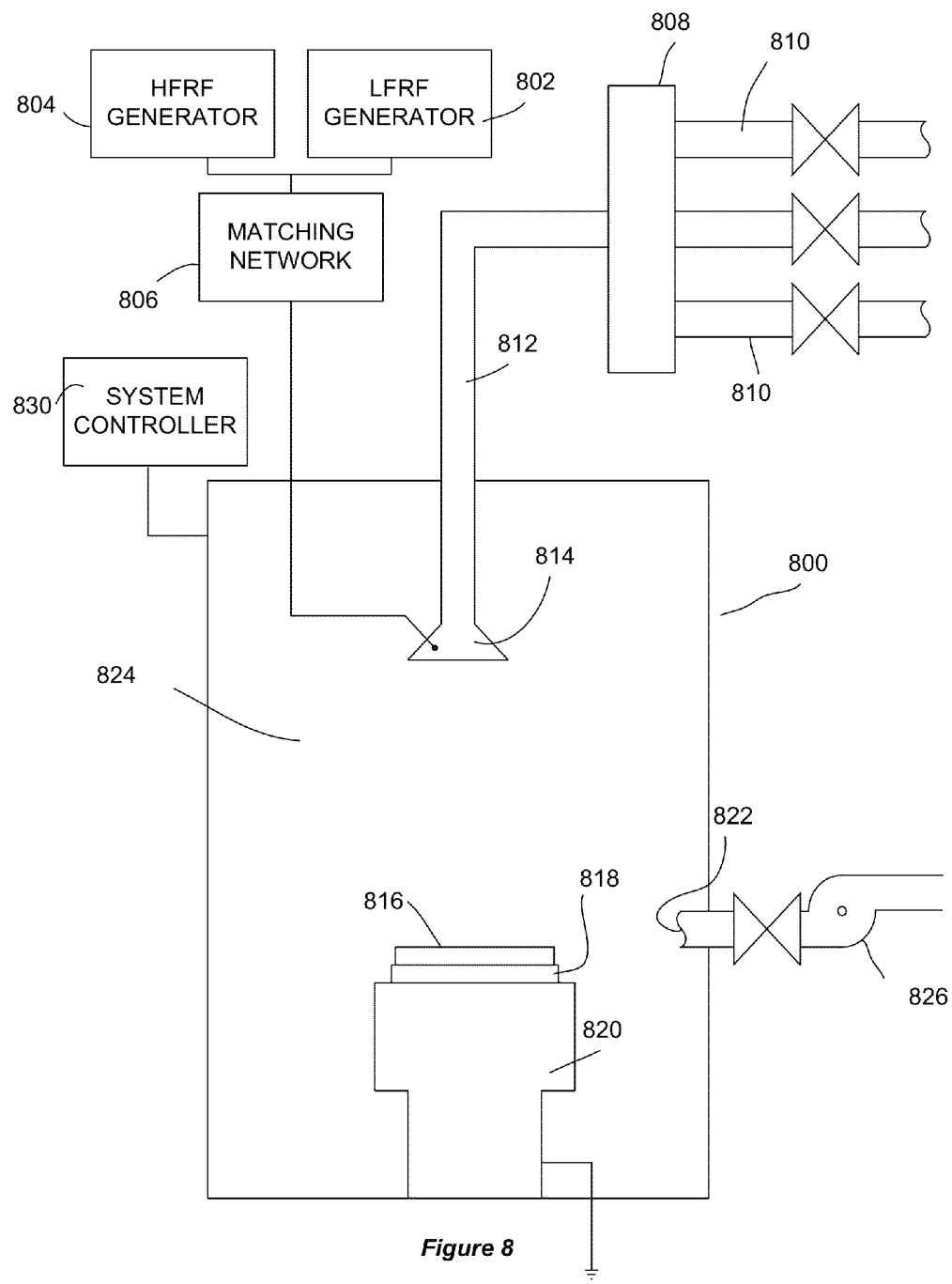
FIG. 8 is a schematic representation of a PECVD apparatus capable of using low frequency (LF) and high frequency (HF) radio frequency plasma sources that can be used for depositing hard mask films in accordance with some embodiments of present invention.

Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In some embodiments, a wafer undergoing hard mask layer deposition is transferred from one station to another within the reactor during the process. While in process, each wafer is held in place by a pedestal, wafer chuck and/or other wafer holding apparatus. For operations in which the wafer is to be heated, the apparatus may include a heater such a heating plate FIG. 8 provides a simple block diagram depicting various reactor components of a suitable PECVD reactor arranged for implementing the present invention. As shown, a reactor 800 includes a process chamber 824, which encloses other components of the reactor and serves to contain the plasma generated by a capacitor type system including a showerhead 814 working in conjunction with a grounded heater block 820. A high-frequency RF generator 804 and a low-frequency RF generator 802 are connected to a matching network 806 that, in turn is connected to showerhead 814.

Within the reactor, a wafer pedestal 818 supports a substrate 816. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. Appropriate valving and mass flow control mechanisms are employed to ensure that the correct gases are delivered during the deposition and plasma treatment phases of the process.

In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 824 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

In some embodiments, a system controller 830 (which may include one or more physical or logical controllers) controls some or all of the operations of a deposition chamber. The system controller 830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller 830 or they may be provided over a network. In certain embodiments, the system controller 830 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the wafer, the frequency and power applied to coils or other plasma generation components, wafer position, wafer movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 830. The instructions for setting process conditions for a deposition operation may be included in a corresponding deposition recipe phase, for example.

Other computer software and/or programs may be employed in some embodiments. Examples of programs or sections of programs for this purpose include wafer positioning program, a process gas composition control program, a pressure control program, a heater control program, and an RF power supply control program.

In some cases, the controller 830 controls gas concentration, wafer movement, and/or the power supplied to the heater block 820 and/or wafer pedestal 818. The controller 830 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the heater block 820 and/or wafer pedestal 818 may be controlled to provide particular RF power levels.

The system controller 830 may control these and other aspects based on sensor output (e.g., when power, potential, pressure, etc. reach a certain threshold), the timing of an operation (e.g., opening valves at certain times in a process), or based on received instructions from the user.

Figure 9:
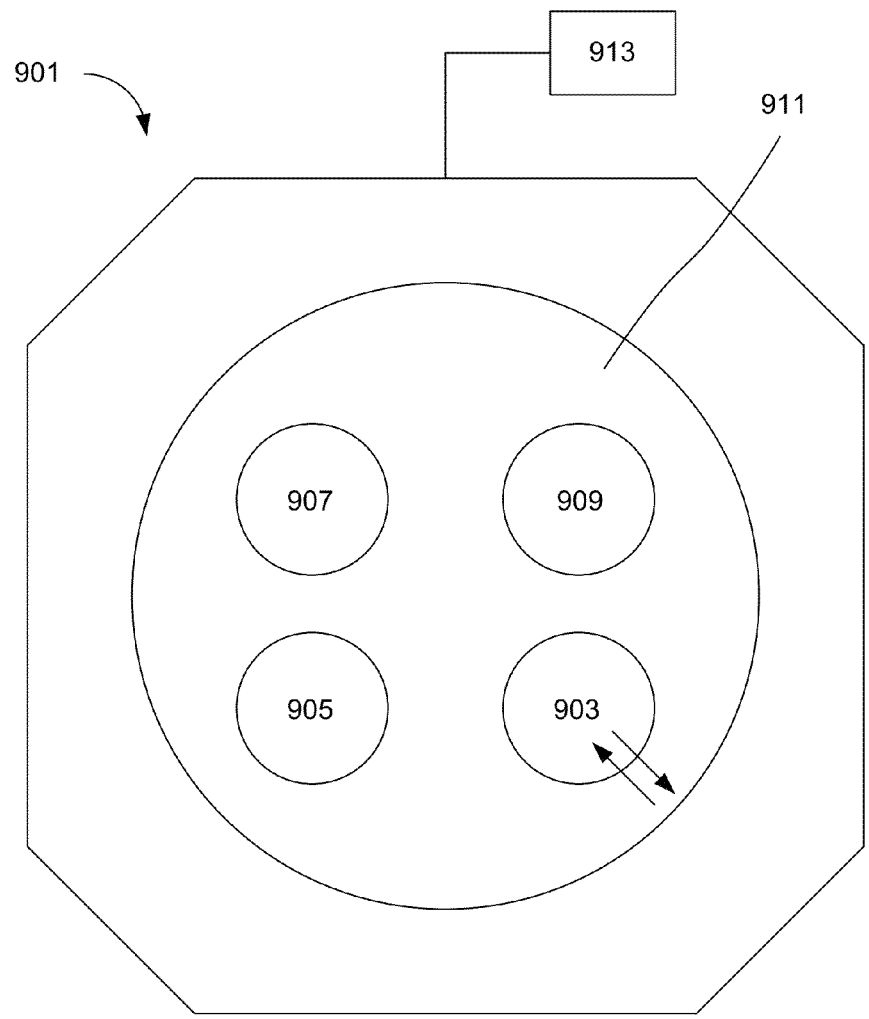
FIG. 9 is a schematic representation of a multi-station PECVD apparatus suitable for forming hard mask films in accordance with some embodiments of present invention.

In some embodiments a multi-station apparatus may be used for depositing a hard mask layer. The multi-station reactor allows one to run different or same processes concurrently in one chamber environment, thereby increasing the efficiency of wafer processing. An example of such an apparatus is depicted in FIG. 9. A schematic presentation of top view is shown. An apparatus chamber 901 comprises four stations 903-909. In general, any number of stations is possible within the single chamber of a multi-station apparatus. Station 903 is used for loading and unloading of the substrate wafers. Stations 903-909 may have the same or different functions and, in some embodiments, can operate under distinct process conditions (e.g., under different temperature regimes).

In some embodiments, the entire hard mask layer is deposited in one station of an apparatus. In other embodiments, a first portion of the hard mask layer is deposited in a first station, the wafer is then transferred to a second station, where the second portion of the same hard mask layer is deposited, and so on, until the wafer returns back to the first station and exits the apparatus.

In one embodiment, stations 903, 905, 907, and 909 all serve for deposition of a hard mask layer. An indexing plate 911 is used to lift the substrates off the pedestals and to accurately position the substrates at the next processing station. After the wafer substrate is loaded at station 903, it is indexed to stations 905, 907, and 909 in succession, wherein a portion of a hard mask layer is deposited at each station. The processed wafer is unloaded at station 903, and the module is charged with a new wafer. During normal operation, a separate substrate occupies each station and each time the process is repeated the substrates are moved to new stations. Thus, an apparatus having four stations 903, 905, 907, and 909 allows simultaneous processing of four wafers.

Wet etch of the oxygen-containing ceramic hard masks may be performed, for example, with a Lam SP Series, Da Vinci® or DV-Prime® single wafer clean tools or more conventional batch wet benches. The wet etch apparatus may include a controller, such as described with reference to the deposition apparatus, including control system software to control some or all of the operations of a wet etch chamber. PECVD and wet etch apparatus may be combined in a semiconductor process tool to facilitate processing of wafer substrates.

Figure 10:
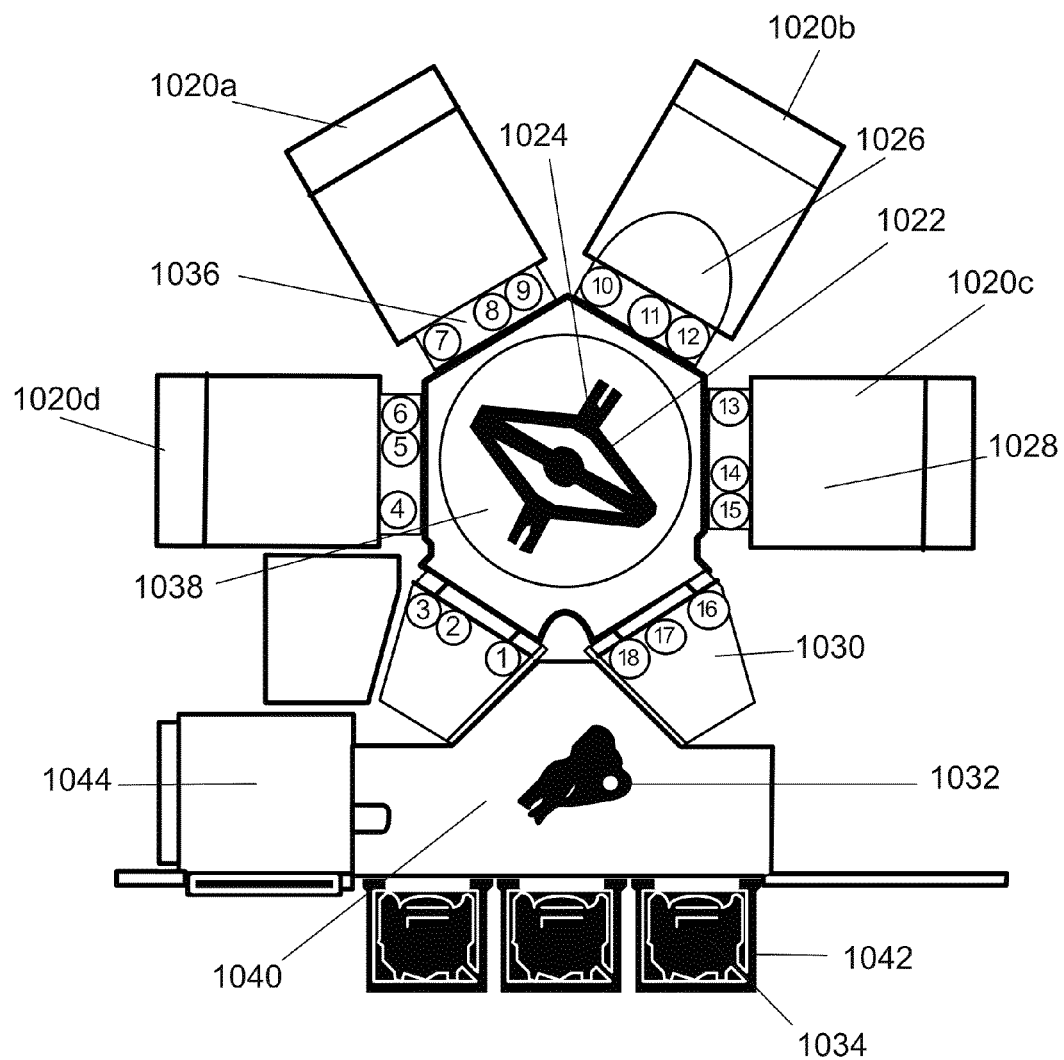
FIG. 10 depicts an embodiment of a multi-station cluster tool in accordance with disclosed embodiments.

FIG. 10 depicts a semiconductor process cluster architecture with various modules that interface with a vacuum transfer module 1038 (VTM). The arrangement of transfer modules to "transfer" wafers among multiple storage facilities and processing modules may be referred to as a "cluster tool architecture" system. Airlock 130, also known as a loadlock or transfer module, is shown in VTM 138 with four processing modules 120a-120d, which may be individual optimized to perform various fabrication processes. By way of example, processing modules 120a-120d may be implemented to perform substrate etching, deposition, ion implantation, wafer cleaning, sputtering, and/or other semiconductor processes. One or more of the substrate etching processing modules (any of 120a-120d) may be implemented as disclosed herein, i.e., for depositing oxygen-containing ceramic hard mask films by PECVD, and for removing oxygen-containing ceramic hard mask films by wet etch, and other suitable functions in accordance with the disclosed embodiments. Airlock 130 and process module 120 may be referred to as "stations." Each station has a facet 136 that interfaces the station to VTM 138. Inside each facet, sensors 1-18 are used to detect the passing of wafer 126 when moved between respective stations.

Robot 122 transfers wafer 126 between stations. In one embodiment, robot 122 has one arm, and in another embodiment, robot 122 has two arms, where each arm has an end effector 124 to pick wafers such as wafer 126 for transport. Front-end robot 132, in atmospheric transfer module (ATM) 140, is used to transfer wafers 126 from cassette or Front Opening Unified Pod (FOUP) 134 in Load Port Module (LPM) 142 to airlock 130. Module center 128 inside process module 120 is one location for placing wafer 126. Aligner 144 in ATM 140 is used to align wafers.

In an exemplary processing method, a wafer is placed in one of the FOUPs 134 in the LPM 142. Front-end robot 132 transfers the wafer from the FOUP 134 to an aligner 144, which allows the wafer 126 to be properly centered before it is etched or processed. After being aligned, the wafer 126 is moved by the front-end robot 132 into an airlock 130. Because airlock modules have the ability to match the environment between an ATM and a VTM, the wafer 126 is able to move between the two pressure environments without being damaged. From the airlock module 130, the wafer 126 is moved by robot 122 through VTM 138 and into one of the process modules 120a-120d. In order to achieve this wafer movement, the robot 122 uses end effectors 124 on each of its arms. Once the wafer 126 has been processed, it is moved by robot 122 from the process modules 120a-120d to an airlock module 130. From here, the wafer 126 may be moved by the front-end robot 132 to one of the FOUPs 134 or to the aligner 144.

Like the deposition and wet etch apparatus, the cluster tool may include a controller, such as described with reference to the deposition apparatus, including control system software to control some or all of the operations of the cluster tool and its component modules.

It should be noted that the computer controlling the wafer movement can be local to the cluster architecture, or can be located external to the cluster architecture in the manufacturing floor, or in a remote location and connected to the cluster architecture via a network.

EXAMPLES

The following Examples demonstrate the suitability of oxygen-containing films in accordance with the present invention for semiconductor processing schemes.

Oxygen-doped hard masks were prepared using gas flows of $CO_2$ of 0-50% of the total flow of precursor process gases. The table below presents data for films formed from $CO_2$ flows of 0-7.5%:

| O doping | Dep Rate (A/min) | RI @633 nm | K @633 nm | Stress (MPa) |
|---|---|---|---|---|
| medium (7.5%) | 3000 | 2.4 | 0.09 | −146 |
| low (5%) | 2700 | 2.2 | 0.06 | −91 |
| none | 2400 | 2.2 | 0.06 | −94 |

The table shows the changes in the film properties as oxygen is added to a ceramic hard mask. Adding oxygen increases the refractive index (RI) and compressive stress of the films, but the oxygen-doped ceramic films have properties that are compatible with use as masks.

Figure 7:
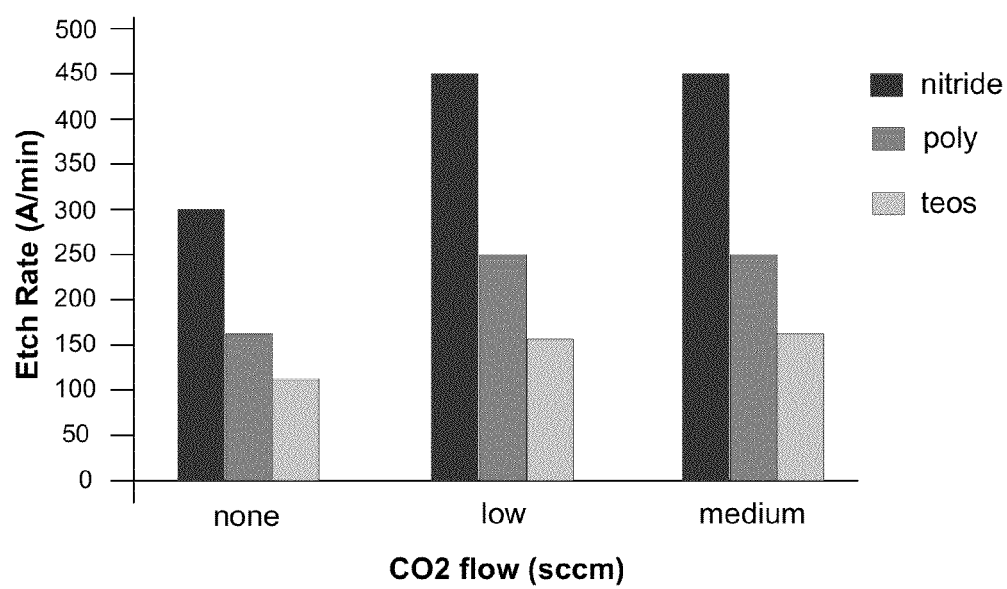
FIG. 7 is an experimental plot illustrating the suitability of oxygen-doped ceramic films as hard masks.

The suitability of these oxygen-doped ceramic films as hard masks is further demonstrated by the data presented in the plot in FIG. 7. The dry etch rates of the hard mask films presented in the table above were tested in nitride, polycrystalline silicon, and TEOS-based etches. It is desirable for the etch rates in these etches to be as low as possible in order to increase the selectivity to these films. As shown in the plot, adding oxygen to the ceramic hard mask films has only a small effect on the etch rates of the films in the nitride, polycrystalline silicon, and TEOS-based etches. This translates into only a small etch selectivity difference for the oxygen-doped films relative to the undoped films when used as a hard mask. Therefore, the oxygen-containing films are suitable for use to pattern many films including silicon nitride, silicon oxide, and polycrystalline silicon films.

When combined with the property of the oxygen-containing films that they are removable by wet etching without CMP, oxygen-containing ceramic hard mask materials should facilitate integration of a ceramic hard mask processing solution in both logic and memory applications.

CONCLUSION

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. It is understood, that in certain embodiments the hard mask film may not necessarily be actively used for masking in lithography, but may simply serve as a hard protective layer for underlying materials.

What is claimed is:

1. A method of forming a hard mask film on a semiconductor substrate, the method comprising:
   receiving a semiconductor substrate in a plasma-enhanced chemical vapor deposition (PECVD) process chamber; and
   forming by PEVCD on the substrate an oxygen-containing ceramic hard mask film, the film being etch selective to copper, resistant to plasma dry-etch and removable by wet-etch;
   wherein the film formation comprises,
      flowing a process gas consisting essentially of He, $C_2H_2$, $CO_2$ and $B_2H_6$, and a carrier gas into the process chamber; and
      forming plasma to deposit the oxygen-containing ceramic hard mask film consisting essentially of the elements C, H, B and at least 5% O on the substrate.

2. The method of claim 1, wherein the percentage of precursors relative to total process gas flow is about He 80-83%/$C_2H_2$ 10-11%/$CO_2$ 5-8%/$B_2H_6$ 2-3%.

3. The method of claim 2, wherein the percentage of precursors relative to total process gas flow is about He 82%/$C_2H_2$ 10.5%/$CO_2$ 5%/$B_2H_6$ 2.5%.

4. The method of claim 2, wherein the percentage of precursors relative to total process gas flow is about He 80%/$C_2H_2$ 10%/$CO_2$ 7.5%/$B_2H_6$ 2.5%.

5. The method of claim 1, wherein the total flow of precursor process gas is about 10000 sccm.

6. The method of claim 1, further comprising removing the oxygen-containing ceramic hard mask film from the substrate with a wet etch.

7. The method of claim 6, where in the wet etch chemistry comprises an oxidant and a strong acid or base compound.

8. The method of claim 7, wherein the wet etch chemistry further comprises a metal corrosion inhibitor.

9. The method of claim 6, where in the wet etch chemistry comprises water.

10. The method of claim 9, wherein the wet etch chemistry further comprises a metal corrosion inhibitor.

11. The method of claim 1, wherein the formed hard mask layer is deposited over a layer of dielectric having a dielectric constant of less than about 2.8, and wherein the formed hard mask film has an etch selectivity of at least about 8:1 versus the dielectric in a dry plasma etch.

12. The method of claim 1, wherein the formed hard mask layer is deposited over a layer of polysilicon.

13. The method of claim 1, wherein the wet etch chemistry comprises 1:1 96% $H_2SO_4$:30% $H_2O_2$.

14. An apparatus for processing a hard mask film on a semiconductor substrate, the apparatus comprising:
   a plasma-enhanced chemical vapor deposition (PECVD) process chamber;
   a support in the process chamber for a semiconductor wafer substrate for holding the wafer substrate in position during hard mask deposition; and
   a controller comprising program instructions for a process of:
      receiving a semiconductor wafer substrate in a plasma-enhanced chemical vapor deposition (PECVD) process chamber; and
      forming by PEVCD on the substrate an oxygen-containing ceramic hard mask film, the film being etch selective to copper, resistant to plasma dry-etch and removable by wet-etch, and wherein the film formation comprises,
         flowing a process gas consisting essentially of He, $C_2H_2$, $CO_2$ and $B_2H_6$, and a carrier gas into the process chamber; and
         forming plasma to deposit the oxygen-containing ceramic hard mask film consisting essentially of the elements C, H, B and at least 5% O on the substrate.

15. The apparatus of claim 14, further comprising:
a wet etch process chamber; and
a controller comprising program instructions for a process of:
receiving the semiconductor wafer substrate with the oxygen-containing ceramic hard mask film formed thereon; and
removing the oxygen-containing ceramic hard mask film from the substrate with a wet etch.

16. The apparatus of claim 14, wherein the wet etch chemistry comprises 1:1 96% $H_2SO_4$: 30% $H_2O_2$.

* * * * *